(12) United States Patent
Cho

(10) Patent No.: US 11,081,146 B2
(45) Date of Patent: Aug. 3, 2021

(54) STORAGE DEVICE AND OPERATING METHOD OF THE STORAGE DEVICE FOR CONTROLLING VOLTAGE RISING TIME

(71) Applicant: SK hynix Inc., Icheon-si (KR)

(72) Inventor: Hyun Chul Cho, Seoul (KR)

(73) Assignee: SK hynix Inc., Icheon-si (KR)

( * ) Notice: Subject to any disclaimer, the term of this patent is extended or adjusted under 35 U.S.C. 154(b) by 7 days.

(21) Appl. No.: 16/670,795

(22) Filed: Oct. 31, 2019

(65) Prior Publication Data

US 2020/0234740 A1 Jul. 23, 2020

(30) Foreign Application Priority Data

Jan. 21, 2019 (KR) ........................ 10-2019-0007715

(51) Int. Cl.
| | |
|---|---|
| *G11C 5/14* | (2006.01) |
| *G11C 16/16* | (2006.01) |
| *G11C 16/28* | (2006.01) |
| *G11C 16/30* | (2006.01) |
| *G11C 16/32* | (2006.01) |
| *G11C 7/22* | (2006.01) |

(52) U.S. Cl.
CPC .............. *G11C 5/145* (2013.01); *G11C 5/147* (2013.01); *G11C 7/222* (2013.01); *G11C 16/16* (2013.01); *G11C 16/28* (2013.01); *G11C 16/30* (2013.01); *G11C 16/32* (2013.01)

(58) Field of Classification Search
CPC ......... G11C 5/145; G11C 16/16; G11C 5/147; G11C 7/222; G11C 16/30; G11C 16/32; G11C 16/28; G11C 16/10; G11C 16/0483; G11C 2029/0409; G11C 29/50012; G11C 29/24
See application file for complete search history.

(56) References Cited

U.S. PATENT DOCUMENTS

| | | | |
|---|---|---|---|
| 2013/0163324 A1* | 6/2013 | Noh ................... | G11C 16/0483 365/185.02 |
| 2014/0146620 A1* | 5/2014 | Park ........................ | G11C 7/08 365/189.09 |
| 2017/0333550 A1* | 11/2017 | Colloca .................. | C12N 15/86 |
| 2019/0198096 A1* | 6/2019 | Mirichigni ............. | G11C 16/30 |
| 2020/0234740 A1* | 7/2020 | Cho ....................... | G11C 16/28 |

FOREIGN PATENT DOCUMENTS

| | | |
|---|---|---|
| KR | 1020140132988 A | 11/2014 |
| KR | 1020150116351 A | 10/2015 |

* cited by examiner

*Primary Examiner* — Gene N Auduong
(74) *Attorney, Agent, or Firm* — William Park & Associates Ltd.

(57) ABSTRACT

The present disclosure relates to method of operating a memory device, the memory device includes a memory cell array, a voltage generator, and control logic. The voltage generator configured to increase a power supply voltage. The control logic is configured to store a time based on the increased power supply voltage and a reference voltage. The reference voltage is a voltage level used to perform an operation on the memory cell array.

20 Claims, 13 Drawing Sheets

STORAGE DEVICE AND OPERATING METHOD OF THE STORAGE DEVICE FOR CONTROLLING VOLTAGE RISING TIME

CROSS-REFERENCE TO RELATED APPLICATION

The present application claims priority under 35 U.S.C. § 119(a) to Korean patent application number 10-2019-0007715 filed on Jan. 21, 2019, in the Korean Intellectual Property Office, the entire disclosure of which is incorporated herein by reference.

BACKGROUND

1. Technical Field

Various embodiments relate generally to an electronic device and, more particularly, to a storage device and an operating method of the storage device.

2. Related Art

A storage device may store data in response to control of a host device such as a computer, a smartphone, and a smartpad. Examples of the storage device may include a device for storing data in a magnetic disk, such as a hard disk drive (HDD), and a device for storing data in a semiconductor memory, such as a solid state drive (SSD) or a memory card, especially in a nonvolatile memory.

A storage device may include a memory device storing data and a memory controller storing data in the memory device. A memory device may be classified into a volatile memory and a nonvolatile memory. Nonvolatile memories may include read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), and ferroelectric RAM (FRAM).

SUMMARY

According to an embodiment, a memory device may include a memory cell array including at least one memory block, a voltage generator configured to receive a power supply voltage and increase the power supply voltage until the increased power supply voltage is equal to or greater than a reference voltage, and a control logic configured to initiate, at a first time, when the voltage generator begins increasing the power supply voltage and store a second time corresponding to when the increased power supply voltage is equal to or greater than the reference voltage. The reference voltage may be a voltage level used to perform an operation on the memory cell array.

According to an embodiment, a method of operating a memory device including a memory cell array may include increasing a power supply voltage on the basis of a voltage generating signal; generating a comparison signal by comparing an increased voltage with a reference voltage when the power supply voltage is increased; and storing a state change time of the comparison signal. The reference voltage may be a voltage level used in performing an operation on the memory cell array.

According to an embodiment, a storage device may be provided. The storage device may include a memory device and a memory controller configured to control a memory. The memory controller may include a status information determining unit configured to receive status information generated based on a voltage rising time of the memory device and configured to provide voltage setting information for generating an operating voltage of the memory device on the basis of the status information. The memory controller may include a device voltage control unit configured to provide the memory device with a set parameter command for generating an operating voltage of the memory device based on the voltage setting information. The voltage rising time may be a time taken until the operating voltage reaches a target reference voltage.

DETAILED DESCRIPTION

Advantages and features and methods for achieving them will be made clear from embodiments described below with reference to the accompanying drawings. However, they may be embodied in different forms and should not be construed as limited to the embodiments set forth herein.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as " . . . between," "immediately . . . between" or "adjacent to . . . " and "directly adjacent to . . . " may be construed similarly.

Hereinafter, examples of embodiments of the present disclosure will be described with reference to the accompanying drawings in order for those skilled in the art to be able to readily implement the technical spirit of the present disclosure.

Various embodiments of the present disclosure may provide a storage device capable of calculating a voltage rising time and an operating method thereof.

Figure 1:
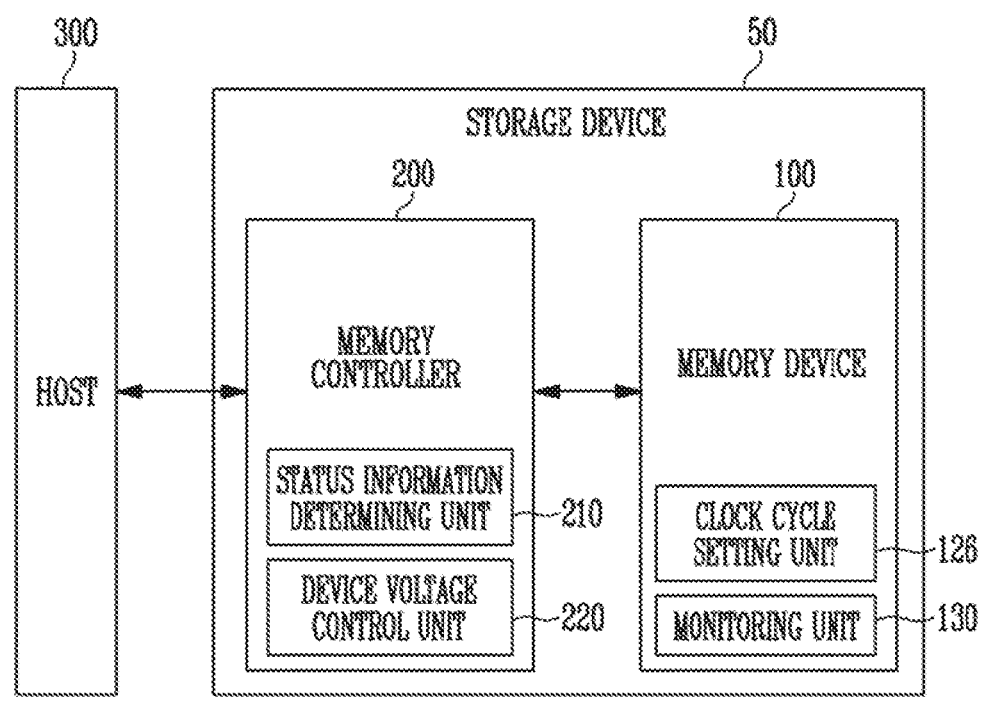
FIG. 1 is a block diagram illustrating a storage device.

FIG. 1 is a block diagram illustrating a storage device 50.

Referring to FIG. 1, the storage device 50 may include a memory device 100 and a memory controller 200.

The storage device 50 may be configured to store data in response to control of a host 300. Examples of the storage device 50 may include a cellular phone, a smartphone, an MP3 player, a laptop computer, a desktop computer, a game player, a TV, a tablet PC, or an in-vehicle infotainment system, etc.

The storage device 50 may be manufactured as one of various types of storage devices according to a host interface corresponding to a communication method with the host 300. For example, the storage device 50 may be configured as any one of various kinds of storage devices such as a solid state drive (SSD), a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and the like.

The storage device 50 may be manufactured by any one of various types of packages. For example, the storage device 50 may be manufactured as any one of various kinds of package types, such as a package-on-package (POP), a system-in-package (SIP), a system-on-chip (SOC), a multi-chip package (MCP), a chip-on-board (COB), a wafer-level fabricated package (WFP), a wafer-level stack package (WSP) and the like.

The memory controller 200 may control general operations of the storage device 50.

When power is applied to the storage device 50, the memory controller 200 may execute firmware FW. When the memory device 100 is a flash memory device, the memory controller 200 may execute firmware such as a Flash Translation Layer (FTL) for controlling communication between the host 300 and the memory device 100.

The memory controller 200 may include a status information determining unit 210. The status information determining unit 210 may determine a status of the memory device 100. The status information determining unit 210 may determine the status of the memory device 100 through a status read command SR_CMD. The status information determining unit 210 may receive status information STA_INF of the memory device 100 in response to the status read command SR_CMD from the memory device 100. The status information STA_INF may be generated based on a voltage rising time of the memory device 100. The voltage rising time may refer to a time taken for an operating voltage to reach a target reference voltage. The memory device 100 may be in a status where the memory device 100 needs to secure stability, or a status in which an operation time of the memory device 100 is to be reduced.

The status information determining unit 210 may output voltage setting information VSET_INF on the basis of the status of the memory device 100. The voltage setting information VSET_INF may include information for setting a device voltage applied to the memory device 100. The device voltage may include an operating voltage for performing a predetermined operation on the memory device 100. In other words, on the basis of the status information STA_INF, the status information determining unit 210 may provide the voltage setting information VSET_INF for generating an operating voltage of the memory device 100 to the device voltage control unit 220. The word "predetermined" as used herein with respect to a parameter, such as an operation etc., means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The memory controller 200 may include a device voltage control unit 220. The device voltage control unit 220 may provide a command for generating the operating voltage of the memory device 100 to the memory device 100 on the basis of the voltage setting information VSET_INF received from the status information determining unit 210. A command for generating the operating voltage of the memory device 10 may include a set parameter command SP_CMD.

For example, the device voltage control unit 220 may set a cycle of a clock CLK for generating an operating voltage. The clock CLK cycle may be for determining a voltage rising time. The voltage rising time may refer to a time taken for an operating voltage to reach a target reference voltage. The device voltage control unit 220 may provide the set parameter command SP_CMD to the memory device 100 to set the clock CLK cycle. The memory device 100 may store a parameter value corresponding to the clock CLK cycle in a register included in the memory device 100 in response to the set parameter command SP_CMD. The memory device 100 may set the clock CLK cycle according to the parameter value stored in the register included in the memory device 100. A cycle of a pump clock PMP_CLK may also be changed on the basis of the cycle of the clock CLK. Therefore, when the cycle of the clock CLK is reduced, the cycle of the pump clock PMP_CLK may also be reduced. On the other hand, when the cycle of the CLK is increased, the cycle of the pump clock PMP_CLK may also be increased.

The memory device 100 may store data. The memory device 100 may operate in response to control of the memory controller 200. The memory device 100 may include a memory cell array including a plurality of memory cells storing data. The memory cell array may include a plurality of memory blocks. Each of the memory blocks may include a plurality of memory cells. Each memory block may include a plurality of pages. According to an embodiment, a page may be a unit for storing data in the memory device 100 or reading data stored in the memory device 100. The memory block may be a unit for erasing data. In an embodiment, examples of the memory device 100 may include a Double Data Rate Synchronous Dynamic Random Access Memory (DDR SDRAM), a Low Power Double Data Rate4 (LPDDR4) SDRAM, a Graphics Double Data Rate (GDDR) SDRAM, a Low Power DDR (LPDDR) SDRAM, a Rambus Dynamic Random Access Memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM), etc. For convenience of explanation, it is assumed that the memory device 100 is a NAND flash memory.

According to an embodiment, the memory device 100 may have a three-dimensional array structure. The present disclosure may be applied not only to a flash memory device in which a charge storage layer includes a conductive floating gate (FG), but also to a charge trap flash (CTF) memory in which a charge storage layer includes an insulating layer.

According to an embodiment, each of the memory cells included in the memory device 100 may be a single level cell (SLC) storing one data bit. Alternatively, each of the memory cells of the memory device 100 may be configured as a multi-level cell (MLC) for storing two data bits, a triple level cell (TLC) for storing three data bits, or a quad level cell (QLC) for storing four data bits.

The memory device 100 may receive a command and an address from the memory controller 200 and access a selected of the memory cell array in response to the address. That is, the memory device 100 may perform an operation corresponding to the command on the area selected by the address. For example, the memory device 100 may perform a write operation (program operation), a read operation, and an erase operation. During a program operation, the memory device 100 may program the area selected by the address with data. During a read operation, the memory device 100 may read data from the area selected by the address. During an erase operation, the memory device 100 may erase data from the area selected by the address.

The memory controller 200 may control the memory device 100 to perform a program, read, or erase operation with the operating voltage.

The memory device 100 may include a clock cycle setting unit 126. The clock CLK may be input from the outside of a voltage generator 122. The voltage rising time may be determined according to the cycle of the clock CLK. The voltage rising time may refer to a time consumed to generate a voltage determined by an operation performed on the memory cell array. As the cycle of the clock CLK is set, the cycle of the pump clock PMP_CLK for determining the voltage rising time may be set. In other words, when the clock CLK has a long cycle, the voltage rising time may be increased. On the other hand, the clock CLK has a short cycle, the voltage rising time may be reduced.

According to an embodiment, the memory device 100 may set the cycle of the clock CLK by the clock cycle setting unit 126. The cycle of the pump clock PMP_CLK may also be changed on the basis of the cycle of the clock CLK. Therefore, when the cycle of the clock CLK is shortened, the cycle of the pump clock PMP_CLK may also be shortened. On the other hand, when the cycle of the CLK is lengthened, the cycle of the pump clock PMP_CLK may also be lengthened. Therefore, the voltage rising time may be determined according to the cycle of the clock CLK.

The memory device 100 may include a monitoring unit 130. The monitoring unit 130 may measure the voltage rising time. For example, a time between when a power supply voltage VCC starts to rise to when the power supply voltage VCC finishes to rise may be measured. The rising start time of the power supply voltage VCC may be a time at which a voltage generating signal VG_SIG in an activated state is received from a control logic 125. The rising end time of the power supply voltage VCC may be a time at which the raised voltage reaches a reference voltage. The reference voltage may be compared so as to generate a voltage necessary to perform an operation on the memory cell array. The reference voltage may be stored in a comparator 129. In an embodiment, a reference voltage may be a voltage used to perform an operation on the memory cell array. In some embodiments, a reference voltage may be the minimum voltage necessary to perform an operation on the memory cell array. In other embodiments, a reference voltage may be greater than the minimum voltage necessary to perform an operation on the memory cell array.

According to an embodiment, the clock cycle setting unit 126 receiving the voltage rising time from the monitoring unit 130 may set the clock CLK cycle. As the clock CLK cycle is set, the cycle of the pump clock PMP_CLK may be set. Therefore, the voltage rising time may be changed by changing the clock CLK cycle.

According to an embodiment, the memory controller 200 may receive data and a logical block address LBA from the host 300 and convert the logical block address LBA into a physical block address PBA indicating an address of memory cells in which data included in the memory device 100 is stored. In addition, the memory controller 200 may store mapping information configuring a mapping relationship between the logical block address LBA and the physical block address PBA.

The memory controller 200 may control the memory device 100 so that a program operation, a read operation or an erase operation may be performed in response to a request from the host 300. During a program operation, the memory controller 200 may provide a program command, the physical block address PBA and data to the memory device 100. During a read operation, the memory controller 200 may provide a read command and the physical block address PBA to the memory device 100. During an erase operation, the memory controller 200 may provide an erase command and the physical block address PBA to the memory device 100.

According to an embodiment, the memory controller 200 may generate and transfer a program command, an address, and data to the memory device 100 in the absence of a request from the host 300. For example, the memory controller 200 may provide a command, an address, and data to the memory device 100 to perform background operations, such as a program operation for wear leveling and a program operation for garbage collection.

According to an embodiment, the memory controller 200 may control at least two memory devices 100. The memory controller 200 may control the memory devices 100 according to an interleaving scheme to improve operation performance.

The host 300 may communicate with the storage device 50 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods, etc.

Figure 2:
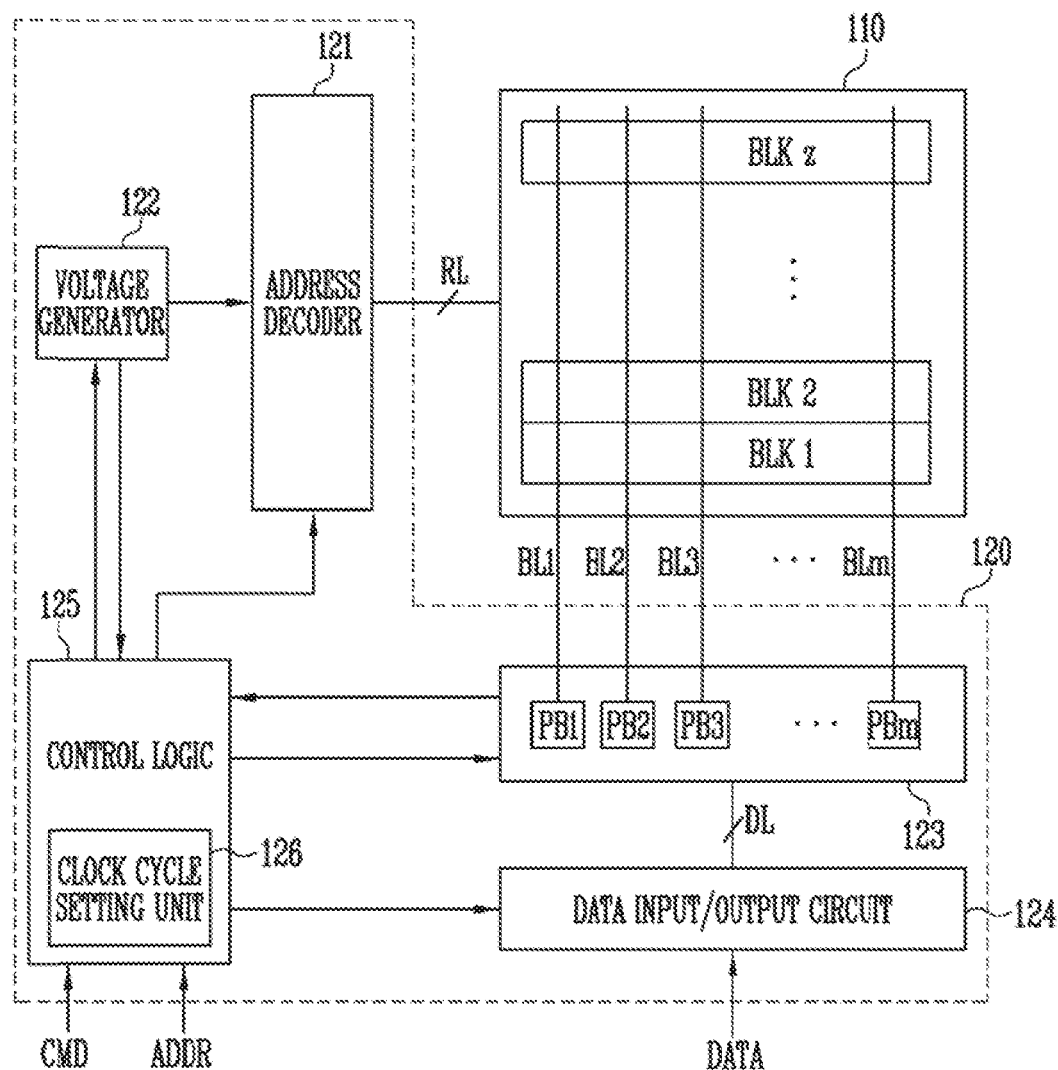
FIG. 2 is a block diagram illustrating the structure of a memory device of FIG. 1.

FIG. 2 is a block diagram illustrating the structure of the memory device 100 of FIG. 1.

Referring to FIG. 2, the memory device 100 may include a memory cell array 110, a peripheral circuit 120, and the control logic 125.

The memory cell array 110 may include a plurality of memory blocks BLK1 to BLKz. Each of the memory blocks BLK1 to BLKz may be coupled to an address decoder 121 through row lines RL and to a read and write circuit 123 through bit lines BL1 to BLm. Each of the plurality of memory blocks BLK1 to BLKz may include a plurality of memory cells. According to an embodiment, the plurality of memory cells may be nonvolatile memory cells.

The plurality of memory cells included in the memory cell array 110 may be divided into a plurality of blocks according to their purpose. System information including various types of setup information necessary to control the memory device 100 may be stored in the plurality of blocks.

Each of the first to zth memory blocks BLK1 to BLKz may include a plurality of cell strings. First to mth cell strings may be coupled to first to mth bit lines BL1 to BLm, respectively. Each of the first to mth cell strings may include a drain select transistor, a plurality of memory cells coupled in series, and a source select transistor. A drain select transistor DST may be coupled to a drain select line DSL. The first to nth memory cells may be coupled to each of first to nth word lines. A source select transistor SST may be coupled to a source select line SSL. A drain side of the drain select transistor DST may be coupled to a corresponding bit line. Drain select transistors of the first to mth cell strings may be coupled to the first to mth bit lines BL1 to BLm, respectively. A source side of the source select transistor SST may be coupled to a common source line CSL. According to an embodiment, the common source line CSL may be commonly connected to the first to zth memory blocks BLK1 to BLKz. The drain select line DSL, first to nth word lines WL1 to WLn and the source select line SSL may be included in the row lines RL. The drain select line DSL, the first to nth word lines WL1 to WLn and the source select line SSL may be controlled by the address decoder 121. The common source line CSL may be controlled by the control logic 125. The first to mth bit lines BL1 to BLm may be controlled by the read and write circuit 123.

The peripheral circuit 120 may include the address decoder 121, the voltage generator 122, the read and write circuit 123, a data input/output circuit 124, and the control logic 125.

The address decoder 121 may be coupled to the memory cell array 110 through the row lines RL. The address decoder 121 may be configured to operate in response to the control logic 125. The address decoder 121 may receive an address ADDR through the control logic 125.

According to an embodiment, a program operation and a read operation of the memory device 100 may be performed in units of pages.

During the program and read operations, the address ADDR received by the control logic 125 may include a block address and a row address. The address decoder 121 may be configured to decode the block address from the received address ADDR. The address decoder 121 may select one of the memory blocks BLK1 to BLKz according to the decoded block address.

The address decoder 121 may be configured to decode the row address from the received address ADDR. The address decoder 121 may select a single word line of a selected memory block by applying voltages provided from the voltage generator 122 to the row lines RL on the basis of the decoded row address.

During an erase operation, the address ADDR may include a block address. The address decoder 121 may decode the block address and select one memory block according to the decoded block address. The erase operation may be formed on part or all of a single memory block.

During a partial erase operation, the address ADDR may include block and row addresses. The address decoder 121 may select one of the memory blocks BLK1 to BLKz according to the decoded block address.

The address decoder 121 may be configured to decode the row address from the received address ADDR. The address decoder 121 may select at least one single word line of the selected memory block by applying voltages provided from the voltage generator 122 to the row lines RL on the basis of the decoded row address.

According to an embodiment, the address decoder 121 may include a block decoder, a word line decoder and an address buffer.

The voltage generator 122 may be configured to generate a plurality of voltages by using an external power voltage supplied to the memory device 100. The voltage generator 122 may be controlled by the control logic 125.

According to an embodiment, the voltage generator 122 may generate an internal power voltage by regulating the external power voltage. The internal power voltage generated by the voltage generator 122 may be used as an operating voltage of the memory device 100.

According to an embodiment, the voltage generator 122 may generate a plurality of voltages by using the external power voltage or the internal power voltage. For example, the voltage generator 122 may include a plurality of pumping capacitors receiving the internal power voltage and generate a plurality of voltages by selectively activating the plurality of pumping capacitors in response to control of the control logic 125. The generated voltages may be applied to selected word lines by the address decoder 121.

During a program operation, the voltage generator 122 may generate a high-voltage program pulse and a pass pulse lower than the program pulse. During a read operation, the voltage generator 122 may generate a read voltage and a pass voltage greater than the read voltage. During an erase operation, the voltage generator 122 may generate an erase voltage.

The read and write circuit 123 may include first to mth page buffers PB1 to PBm. The first to mth page buffers PB1 to PBm may be coupled to the memory cell array 110 through the first to mth bit lines BL1 to BLm, respectively. The first to mth page buffers PB1 to PBm may operate in response to control of the control logic 125.

The first to mth page buffers PB1 to PBm may communicate data with the data input/output circuit 124. During a program, the first to mth page buffers PB1 to PBm may receive data DATA to be stored through the data input/output circuit 124 and data lines DL.

During a program operation, when a program pulse is applied to a selected word line, the first to mth page buffers PB1 to PBm may transfer the data DATA received through the data input/output circuit 124 to selected memory cells through the bit lines BL1 to BLm. Memory cells of a selected page may be programmed according to the transferred data DATA. A memory cell coupled to a bit line to which a program permission voltage (e.g., a ground voltage) is applied may have an increased threshold voltage. A threshold voltage of a memory cell coupled to a bit line to which a program inhibition voltage (for example, a power voltage) is applied may be maintained. During a program verify operation, the first to mth page buffers PB1 to PBm may read page data from the selected memory cells through the bit lines BL1 to BLm.

During a read operation, the read and write circuit 123 may read the data DATA from the memory cells of the selected page through the bit lines BL and output the read data DATA to the data input/output circuit 124. During an erase operation, the read and write circuit 123 may float the bit lines BL.

According to an embodiment, the read and write circuit 123 may include a column selection circuit.

The data input/output circuit 124 may be coupled to the first to mth page buffers PB1 to PBm through the data lines DL. The data input/output circuit 124 may operate in response to control of the control logic 125. During a program, the data input/output circuit 124 may receive the data DATA to be stored from an external controller (not illustrated).

The control logic 125 may be coupled to the address decoder 121, the voltage generator 122, the read and write circuit 123 and the data input/output circuit 124. The control logic 125 may control the general operations of the semiconductor memory device 100. The control logic 125 may receive a command CMD and the address ADDR from the external controller. The control logic 125 may be configured to control the address decoder 121, the voltage generator 122, the read and write circuit 123 and the data input/output circuit 124 in response to the command CMD.

The control logic 125 may output the voltage generating signal VG_SIG to the voltage generator 122. The voltage generating signal VG_SIG may be for generating a voltage necessary for an operation performed by the memory cell array 110. The control logic 125 may output the voltage generating signal VG_SIG in an activated state for the generation of a voltage to the voltage generator 122. The voltage generating signal VG_SIG may be maintained at the activated state while a voltage rising from the power supply voltage is provided to the memory cell array 110.

According to an embodiment, the control logic 125 may store a first time at which the control logic 125 outputs the voltage generating signal VG_SIG in the activated state. The control logic 125 may store information about the first time in the register included in the control logic 125 when the voltage generating signal VG_SIG in the activated state is output.

According to an embodiment, the control logic 125 may receive a comparison signal COM_SIG from the voltage generator 122. The control logic 125 may store a second time corresponding to a state change time of the comparison signal COM_SIG. The control logic 125 may store information about the second time in the register included in the control logic 125 when receiving the comparison signal COM_SIG. The state change time of the comparison signal COM_SIG may refer to a time at which the comparison signal COM_SIG changes from an activated state to a deactivated state, or a time at which the comparison signal COM_SIG changes from the deactivated state to the activated state.

According to an embodiment, the control logic 125 may calculate a voltage rising time between the first time and the second time. In some embodiments, the voltage rising time is the duration of time that elapses from the first time to the second time. The clock cycle setting unit 126 included in the control logic 125 may set the cycle of the clock CLK on the basis of the voltage rising time between the first time and the second time.

The control logic 125 may include a clock cycle setting unit 126. The clock CLK may be input from the outside of the voltage generator 122. The clock CLK cycle may be for determining a voltage rising time. The voltage rising time may refer to a time taken for an operating voltage to reach a target reference voltage. The reference voltage may be compared with a voltage to which the power supply voltage VCC is increased to generate a voltage necessary to perform an operation on the memory cell array. When the pump clock PMP_CLK has a long cycle, the voltage rising time may be increased. When the pump clock PMP_CLK has a short cycle, the voltage rising time may be decreased.

According to an embodiment, the clock cycle setting unit 126 may set the cycle of the clock CLK on the basis of the voltage rising time. For example, the clock cycle setting unit 126 may increase the clock CLK cycle when the voltage rising time is shorter than a reference time. On the other hand, when the voltage rising time is shorter than the reference time, the clock CLK cycle may be reduced. The reference time may be a predetermined time. The cycle of the pump clock PMP_CLK may also be changed on the basis of the changed cycle of the clock CLK. Therefore, when the cycle of the clock CLK is shortened, the cycle of the pump clock PMP_CLK may also be shortened. On the other hand, when the cycle of the CLK is lengthened, the cycle of the pump clock PMP_CLK may also be lengthened. The voltage rising time may be determined according to the cycle of the clock CLK.

According to an embodiment, the clock cycle setting unit 126 may set the cycle of the clock CLK on the basis of the voltage generating signal VG_SIG and the comparison signal COM_SIG. The voltage generating signal VG_SIG may be applied to request the generation of an operating voltage to be applied to the memory cell array 110. The comparison signal COM_SIG may be generated by comparing the reference voltage and the increased voltage on the basis of the voltage generating signal VG_SIG.

For example, the clock cycle setting unit 126 may set the cycle of the clock CLK on the basis of the voltage rising time. The voltage rising time may be a time between the first time at which the voltage generating signal VG_SIG in the activated state is output and the second time when the state of the comparison signal COM_SIG is changed. Therefore, the clock cycle setting unit 126 may set the cycle of the clock CLK on the basis of the voltage rising time.

According to an embodiment, the clock cycle setting unit 126 may determine whether a voltage rising time VR_TIME is longer or shorter than a reference time. The clock cycle setting unit 126 may set the cycle of the clock CLK according to a result of the determination.

According to an embodiment, when the voltage rising time is shorter than the reference time, the clock cycle setting unit 126 may decrease the clock CLK cycle. On the other hand, when the voltage rising time is longer than the reference time, the clock cycle setting unit 126 may increase the clock CLK cycle. The reference time may be a predetermined voltage rising time. The predetermined reference time may be a minimum or maximum voltage rising time to generate an operating voltage. The predetermined reference time may refer to a time between the minimum voltage rising time and the maximum voltage rising time for generating the operating voltage.

Figure 3:
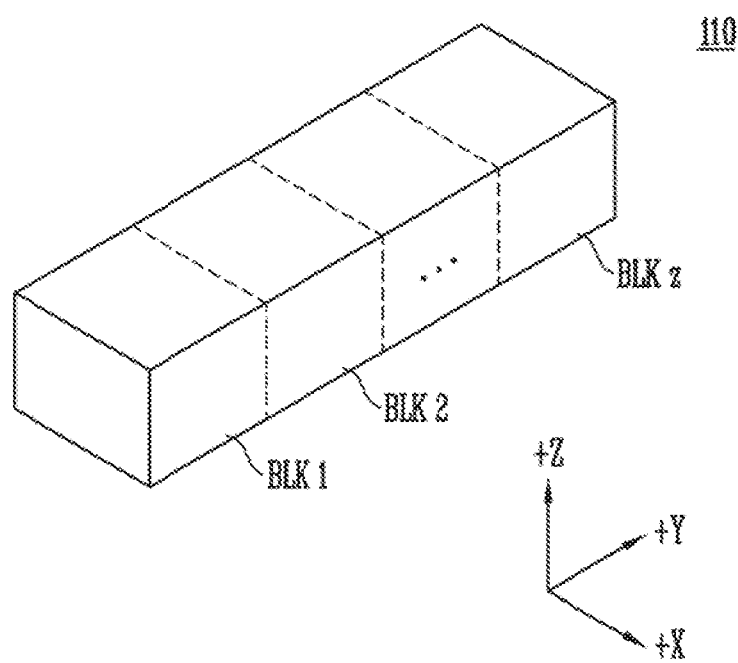
FIG. 3 is a diagram illustrating an embodiment of a memory cell array shown in FIG. 2.

FIG. 3 is a diagram illustrating an embodiment of the memory cell array 110 shown in FIG. 2.

Referring to FIG. 3, the memory cell array 110 may include the plurality of memory blocks BLK1 to BLKz. Each of the memory blocks BLK1 to BLKz may include a three-dimensional structure. Each memory block may include a plurality of memory cells stacked over a substrate. The plurality of memory cells may be arranged in +X direction, +Y direction and +Z direction. The structure of each memory block will be described below with reference to FIGS. 4 and 5.

Figure 4:
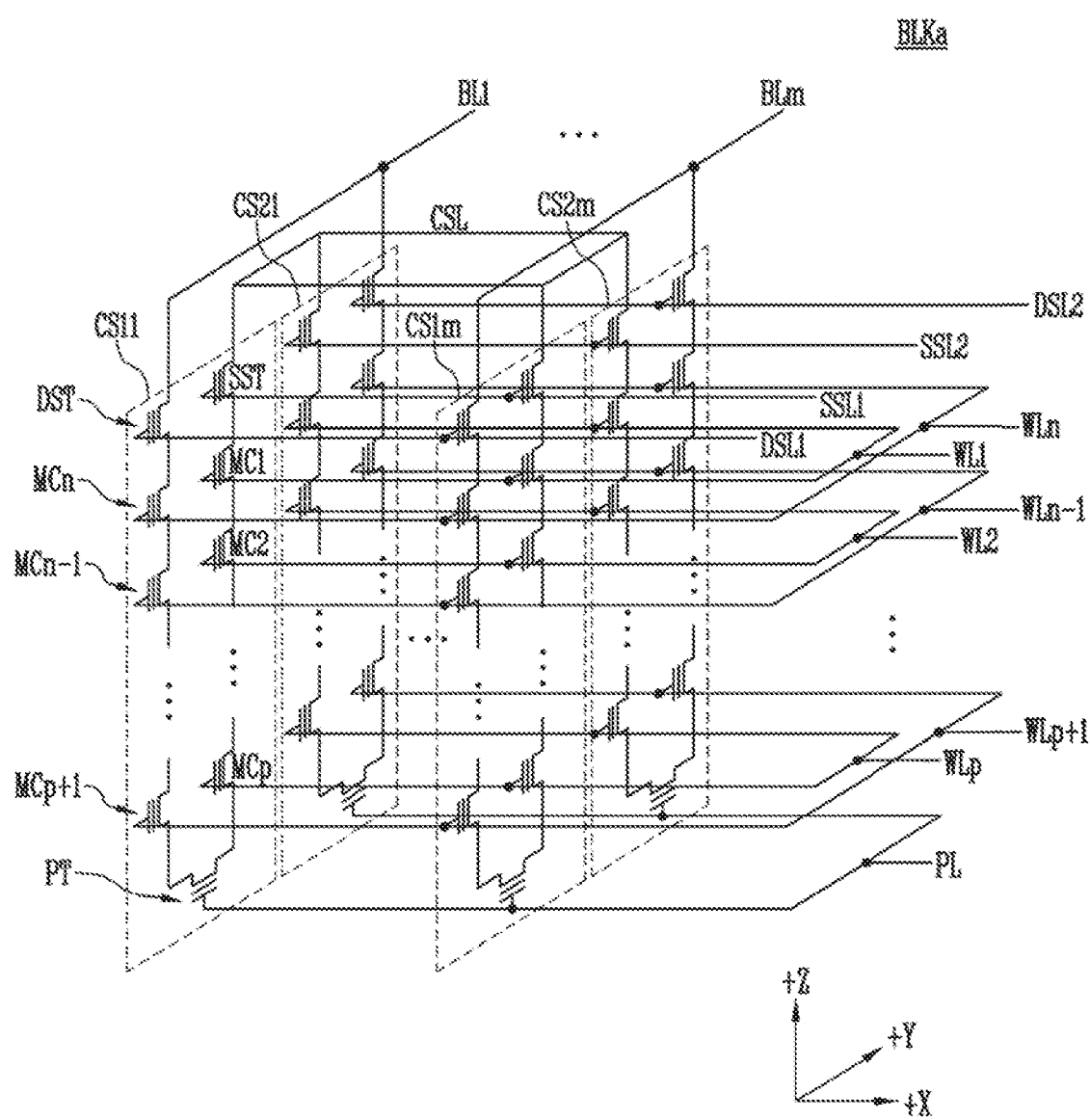
FIG. 4 is a circuit diagram illustrating one (BLKa) of memory blocks BLK1 to BLKz shown in FIG. 3.

FIG. 4 is a circuit diagram illustrating one (BLKa) of the memory blocks BLK1 to BLKz shown in FIG. 3.

Referring to FIG. 4, a memory block BLKa may include a plurality of cell strings CS11 to CS1m and CS21 to CS2m. According to an embodiment, each of the cell strings CS11 to CS1m and CS21 to CS2m may be formed in a U shape. In the memory block BLKa, 'm' cell strings may be arranged in a row direction (i.e., +X direction). FIG. 4 illustrates two cell strings arranged in a column direction (i.e., +Y direction). However, it is understood that three or more cell strings may be arranged in the column direction.

Each of the cell strings CS11 to CS1m and CS21 to CS2m may include at least one source select transistor SST, first to nth memory cells MC1 to MCn, a pipe transistor PT, and at least one drain select transistor DST.

Each of the select transistors SST and DST and each of the memory cells MC1 to MCn may have similar structures to each other. According to an embodiment, each of the select transistors SST and DST and the memory cells MC1 to MCn may include a channel layer, a tunneling insulating layer, a charge storage layer, and a blocking insulating layer. According to an embodiment, a pillar for providing a channel layer may be provided in each cell string. According to an embodiment, a pillar for providing at least one of the channel layer, the tunneling insulating layer, the charge storage layer, and the blocking insulating layer may be provided to each cell string.

The source select transistor SST of each cell string may be coupled between the common source line CSL and first to nth memory cells MC1 to MCp.

According to an embodiment, source select transistors of cell strings arranged in the same row may be coupled to a source select line extending in a row direction, and source select transistors of cell strings arranged in different rows may be coupled to different source select lines. In FIG. 4, the source select transistors SST of the cell strings CS11 to CS1m in the first row may be coupled to a first source select line SSL1. The source select transistors SST of the cell strings CS21 to CS2m in the second row may be coupled to a second source select line SSL2.

According to an embodiment, the source select transistors SST of the cell strings CS11 to CS1m and CS21 to CS2m may be coupled in common to one source select line.

The first to nth memory cells MC1 to MCn of each cell string may be coupled between the source select transistor SST and the drain select transistor DST.

The first to nth memory cells MC1 to MCn may be divided into first to pth memory cells MC1 to MCp and (p+1)th to nth memory cells MCp+1 to MCn. The first to pth memory cells MC1 to MCp may be sequentially arranged in a reverse direction to the +Z direction and may be coupled in series between the source select transistor SST and the pipe transistor PT. The (p+1)th to nth memory cells MCp+1 to MCn may be sequentially arranged in the +Z direction and may be coupled in series between the pipe transistor PT and the drain select transistor DST. The first to pth memory cells MC1 to MCp and the (p+1)th to nth memory cells MCp+1 to MCn may be coupled through the pipe transistor PT. Gates of the first to nth memory cells MC1 to MCn of each cell string may be coupled to first to nth word lines WL1 to WLn, respectively.

A gate of the pipe transistor PT of each cell string may be coupled to a pipe line PL.

The drain select transistor DST of each cell string may be coupled between a corresponding bit line and the memory cells MCp+1 to MCn. Cell strings arranged in the row direction may be coupled to a drain select line extending in the row direction. The drain select transistors DST of the cell strings CS11 to CS1m in the first row may be coupled to a first drain select line DSL1. The drain select transistors DST of the cell strings CS21 to CS2m in the second row may be coupled to a second drain select line DSL2.

Cell strings arranged in the column direction may be coupled to a bit line extending in the column direction. In FIG. 4, the cell strings CS11 and CS21 in the first column may be coupled to the first bit line BL1. The cell strings CS1m and CS2m in an mth column may be coupled to the mth bit line BLm.

Memory cells coupled to the same word line arranged in cell strings arranged in the row direction may form a single page. For example, memory cells coupled to the first word line WL1 in the cell strings CS11 to CS1m in the first row may constitute a single page. Memory cells coupled to the first word line WL1 in the cell strings CS21 to CS2m in the second row may constitute another page. When one of the drain select lines DSL1 and DSL2 is selected, cell strings arranged in one row direction may be selected. When one of the first to nth word lines WL1 to WLn is selected, one page may be selected from the selected cell strings.

In an embodiment, even bit lines and odd bit lines may be provided instead of the first to mth bit lines BL1 to BLm. In addition, even cell strings of the cell strings CS11 to CS1m or CS21 to CS2m arranged in the row direction may be coupled to even bit lines, respectively, and odd cell strings of the cell strings CS11 to CS1m or CS21 to CS2m arranged in the row direction may be coupled to odd bit lines, respectively.

According to an embodiment, at least one of the first to nth memory cells MC1 to MCn may serve as a dummy memory cell. For example, one or more dummy memory cells may be provided to reduce an electric field between the source select transistor SST and the memory cells MC1 to MCp. Alternatively, one or more dummy memory cells may be provided to reduce an electric field between the drain select transistor DST and the memory cells MCp+1 to MCn. When more dummy memory cells are provided, the operational reliability of the memory block BLKa may be improved, whereas the size of the memory block BLKa may be increased. On the other hand, when the number of dummy memory cells decreases, the size of the memory block BLKa may be reduced, and the operational reliability of the memory block BLKa may be reduced.

In order to efficiently control one or more dummy memory cells, each of the dummy memory cells may have a required threshold voltage. Before or after an erase operation on the memory block BLKa, program operations may be performed on a portion or entirety of the dummy memory cells. When an erase operation is performed after a program operation is performed, the dummy memory cells may have required threshold voltages by controlling a voltage applied to dummy word lines coupled to the dummy memory cells.

Figure 5:
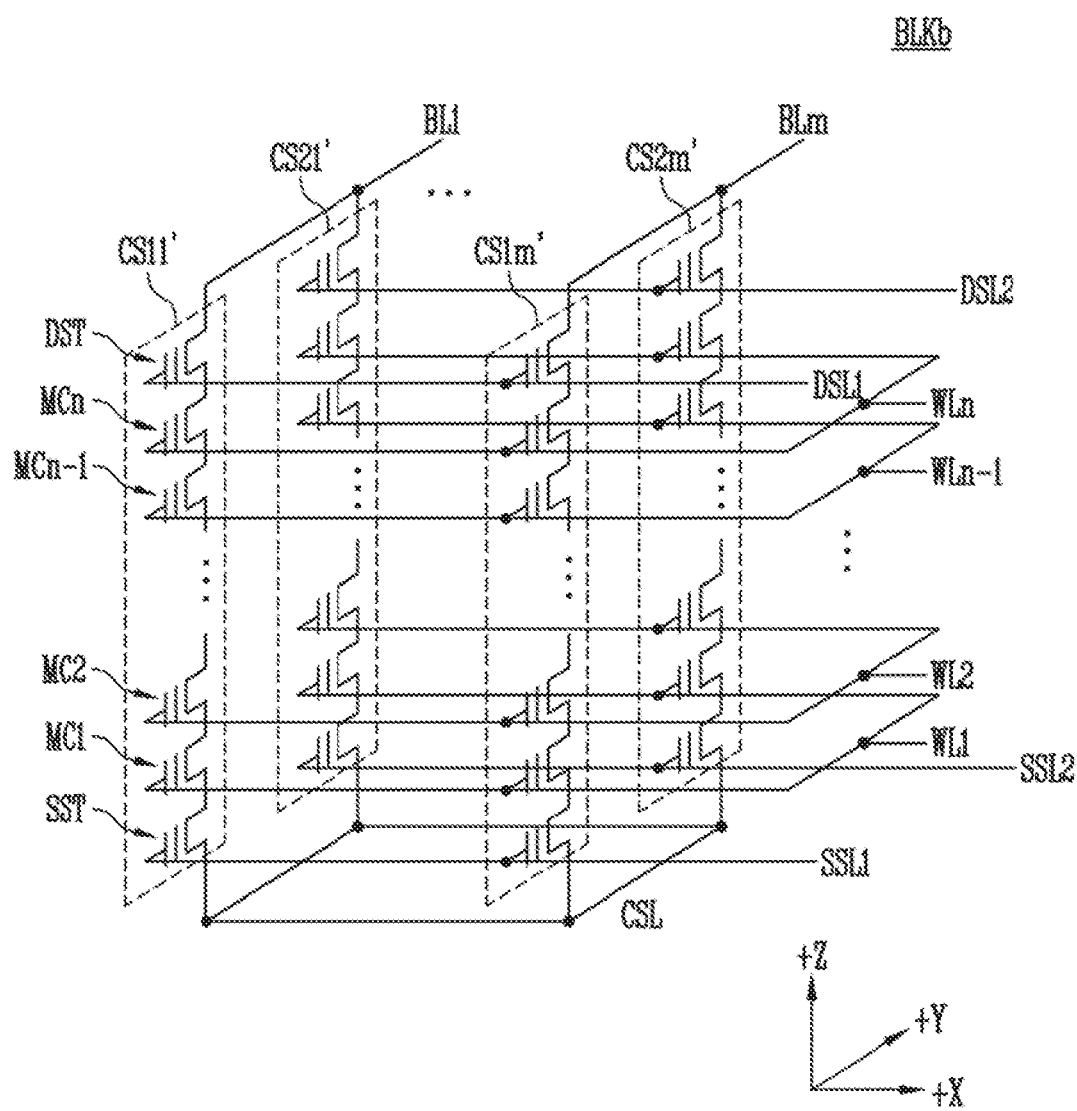
FIG. 5 is a circuit diagram illustrating an embodiment of one (BLKb) of the memory blocks BLK1 to BLKz shown in FIG. 3.

FIG. 5 is a circuit diagram illustrating an embodiment of one (BLKb) of the memory blocks BLK1 to BLKz shown in FIG. 3.

Referring to FIG. 5, a memory block BLKb may include a plurality of cell strings CS1m' to CS1m' and CS2m' to CS2m'. Each of the plurality of cell strings CS1m' to CS1m' and CS2m' to CS2m' may extend in the +Z direction. Each of the plurality of cell strings CS1m' to CS1m' and CS2m' to CS2m' may include at least one source select transistor SST, the first to nth memory cells MC1 to MCn, and at least one drain select transistor DST which are stacked on a substrate (not shown) under a memory block BLKm'.

The source select transistor SST of each cell string may be coupled between the common source line CSL and the first to nth memory cells MC1 to MCn. Source select transistors of cell strings arranged in the same row may be coupled to the same source select line. The source select transistors SST of the cell strings CS1m' to CS1m' arranged in the first row may be coupled to the first source select line SSL1. The source select transistors SST of the cell strings CS2m' to CS2m' arranged in the second row may be coupled to the second source select line SSL2. According to an embodiment, the source select transistors of the cell strings CS1m' to CS1m' and CS2m' to CS2m' may be commonly coupled to a single source select line.

The first to nth memory cells MC1 to MCn of each cell string may be coupled in series between the source select transistor SST and the drain select transistor DST. Gates of the first to nth memory cells MC1 to MCn may be coupled to the first to nth word lines WL1 to WLn, respectively.

The drain select transistor DST of each cell string may be coupled between a corresponding bit line and the memory cells MC1 to MCn. Drain select transistors of cell strings arranged in a row direction may be coupled to a drain select line extending in the row direction. The drain select transistors DST of the cell strings CS1m' to CS1m' in the first row may be coupled to the first drain select line DSL1. The drain select transistors of the cell strings CS2m' to CS2m' in the second row may be coupled to the second drain select line DSL2.

As a result, the memory block BLKb shown in FIG. 5 may have a similar equivalent circuit to the memory block BLKa shown in FIG. 4 except that the pipe transistor PT is removed from each cell string of the memory block BLKb.

In an embodiment, even bit lines and odd bit lines may be provided instead of the first to mth bit lines BL1 to BLm. In addition, even cell strings of the cell strings CS1m' to CS1m' or CS2m' to CS2m' arranged in the row direction may be coupled to the even bit lines, respectively, and odd cell strings of the cell strings CS1m' to CS1m' or CS2m' to CS2m' arranged in the row direction may be coupled to the odd bit lines, respectively.

According to an embodiment, at least one of the first to nth memory cells MC1 to MCn may serve as a dummy memory cell. For example, one or more dummy memory cells may be provided to reduce an electric field between the source select transistor SST and the first to nth memory cells MC1 to MCn. Alternatively, one or more dummy memory cells may be provided to reduce an electric field between the drain select transistor DST and the memory cells MC1 to MCn. When more dummy memory cells are provided, the operational reliability of the memory block BLKa may be improved, whereas the size of the memory block BLKa may be increased. When fewer memory cells are provided, the size of the memory block BLKb may be reduced and the operational reliability of the memory block BLKb may be degraded.

In order to efficiently control one or more dummy memory cells, each of the dummy memory cells may have a required threshold voltage. Before or after an erase operation on the memory block BLKb, program operations may be performed on a portion or entirety of the dummy memory cells. When an erase operation is performed after a program operation is performed, the dummy memory cells may have required threshold voltages by controlling a voltage applied to dummy word lines coupled to the dummy memory cells.

Figure 6:
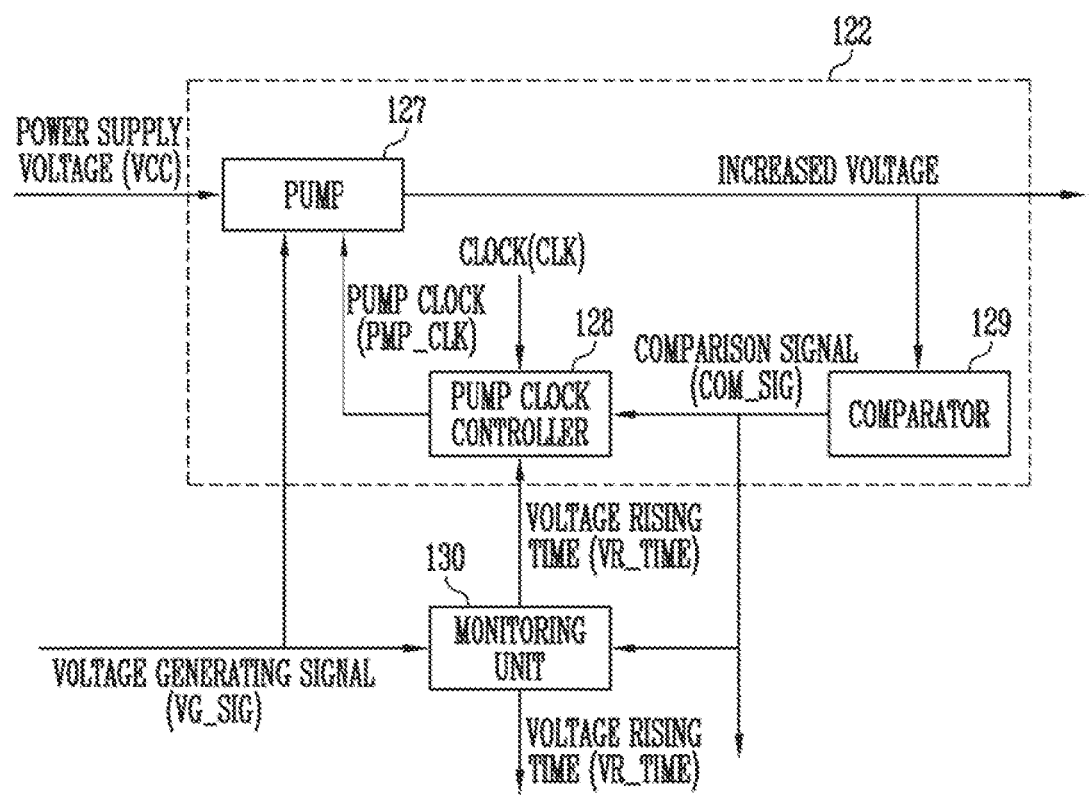
FIG. 6 is a diagram illustrating a structure of a voltage generator of FIG. 2 and a monitoring unit.

FIG. 6 is a diagram illustrating the structure of the voltage generator 122 of FIG. 2 and the monitoring unit 130.

Referring to FIG. 6, the voltage generator 122 may include a pump 127, a pump clock controller 128 and a comparator 129. The voltage generator 122 may increase the power supply voltage VCC to generate an output voltage OUT_VOL necessary for operations performed on the memory cell array 110. The power supply voltage VCC may be increased to reach the output voltage OUT_VOL on the basis of the voltage generating signal VG_SIG. The output voltage OUT_VOL may be determined by operations performed on the memory cell array 110. In addition, the voltage generator 122 may generate the comparison signal COM_SIG by comparing the increased voltage with the output voltage OUT_VOL.

According to an embodiment, the pump 127 included in the voltage generator 122 may receive the power supply voltage VCC. The power supply voltage VCC may be applied from the outside of the voltage generator 122. The pump 127 may pump the received power supply voltage VCC. For example, the pump 127 may pump the power supply voltage VCC on the basis of the pump clock PMP_CLK and the voltage generating signal VG_SIG. In some embodiments, the pump may raise or lower the power supply voltage VCC on the basis of the pump clock PMP_CLK and the voltage generating signal VG_SIG.

The pumped voltage may be the output voltage OUT_VOL output to the memory cell array 110. When the pumped voltage reaches the output voltage OUT_VOL, the output voltage OUT_VOL may serve as an operating voltage necessary for operations of the memory device 100. The output voltage OUT_VOL may be previously set according to each operation to be performed on the memory device 100. The operating voltage may be used by the memory device 100 to perform a predetermined operation.

According to an embodiment, the pump clock PMP_CLK may be determined based on the clock CLK input to the voltage generator 122. The pump clock PMP_CLK may be received from the pump clock controller 128. A method of determining the pump clock PMP_CLK will be described below by describing the pump clock controller 128.

The voltage generating signal VG_SIG may be output from the control logic 125. The voltage generating signal VG_SIG may be output in an activated state when it is necessary to increase the power supply voltage VCC. In addition, the voltage generating signal VG_SIG may be maintained at the activated state until the output voltage OUT_VOL is provided to the memory cell array 110. Therefore, the pump 127 may receive the voltage generating signal VG_SIG in the activated or deactivated state from the control logic 125. According to an embodiment, the control logic 125 may store a first time at which the control logic 125 outputs the voltage generating signal VG_SIG which changes from the deactivated state to the activated state. The first time at which the control logic 125 outputs the voltage generating signal VG_SIG which changes from the deactivated state to the activated state may be a starting point of calculating a voltage rising time.

The pump 127 may output a voltage obtained by pumping the power supply voltage VCC. The pumped voltage may be the output voltage OUT_VOL. The power supply voltage VCC may be pumped until the power supply voltage VCC reaches the output voltage OUT_VOL. The output voltage OUT_VOL may be an operating voltage used by the memory device 100 to perform a predetermined operation.

According to an embodiment, the comparator 129 may receive a voltage which is rising from the power supply voltage VCC output from the pump 127. The comparator 129 may generate the comparison signal COM_SIG on the basis of the increased voltage. For example, the comparator 129 may determine whether the increased voltage has reached a reference voltage or not, and may generate and output the comparison signal COM_SIG. The reference voltage may be compared with the voltage to which the power supply voltage VCC is increased so as to generate a voltage necessary to perform an operation on the memory cell array. The reference voltage may be stored in the comparator 129.

The comparator 129 may generate the comparison signal COM_SIG by comparing the increased voltage with the reference voltage. The reference voltage may be an operating voltage used by the memory device 100 to perform a predetermined operation. The reference voltage may be previously set according to each operation performed by the memory device 100 and may be stored in the comparator 129. The comparator 129 may output the generated comparison signal COM_SIG to the pump clock controller 128. In addition, the comparator 129 may provide the generated comparison signal COM_SIG to the control logic 125, the pump clock controller 128, and the monitoring unit 130.

When the voltage rising from the power supply voltage VCC is less than the reference voltage, the comparator 129 may generate the comparison signal COM_SIG in an activated state. When the increased voltage is greater than or equal to the reference voltage, the comparator 129 may generate the comparison signal COM_SIG in the deactivated state. According to an embodiment, the control logic 125 may store a second time at which the control logic 125 receives the comparison signal COM_SIG which has changed from the activated state to the deactivated state. The second time may refer to a state change time of the comparison signal COM_SIG. The second time may be an end point of calculating the voltage rising time.

According to an embodiment, the pump clock controller 128 may generate and output the pump clock PMP_CLK on the basis of the comparison signal COM_SIG and the externally input clock CLK. The comparison signal COM_SIG may be received from the comparator 129.

For example, the pump clock controller 128 may output the clock CLK as the pump clock PMP_CLK in response to the comparison signal COM_SIG in the activated state. In other words, when the comparison signal COM_SIG received from the comparator 129 is in the activated state, the pump clock controller 128 may output the clock CLK as the pump clock PMP_CLK.

In addition, the pump clock controller 128 may cause the pump clock PMP_CLK to be in a logic low state in response to the comparison signal COM_SIG in the deactivated state. In other words, when the comparison signal COM_SIG received from the comparator 129 is in the deactivated state, the pump clock PMP_CLK may be in the logic low state.

In conclusion, the pump clock controller 128 may output the pump clock PMP_CLK to the pump 127 only when the comparison signal COM_SIG is in the activated state.

The pump 127 may increase the power supply voltage VCC only when the pump clock PMP_CLK is input. Therefore, the pump 127 may pump and output the power supply voltage VCC when receiving the activated voltage generating signal VG_SIG and the pump clock PMP_CLK.

According to an embodiment, the memory device 100 may include the monitoring unit 130. The monitoring unit 130 may receive the voltage generating signal VG_SIG from the control logic 125. In addition, the monitoring unit 130 may receive the comparison signal COM_SIG from the comparator 129. Therefore, the monitoring unit 130 may calculate the voltage rising time VR_TIME on the basis of a time (first time) at which the monitoring unit 130 receives the activated voltage generating signal VG_SIG as a starting point and a time (second time) at which the monitoring unit 130 receives the deactivated comparison signal COM_SIG as an ending point. Therefore, the monitoring unit 130 may store the time (first time) at which the monitoring unit 130 receives the activated voltage generating signal VG_SIG and the time (second time) at which the monitoring unit 130 receives the deactivated comparison signal COM_SIG. The monitoring unit 130 may output the voltage rising time VR_TIME to the pump clock controller 128.

As a result, the monitoring unit 130 as well as the control logic 125 may calculate the voltage rising time VR_TIME. In addition, the monitoring unit 130 may determine whether the voltage rising time VR_TIME is longer or shorter than a reference time. The monitoring unit 130 may set the cycle of the clock CLK depending on whether the voltage rising time VR_TIME is longer or shorter than the reference time.

The voltage rising time VR_TIME calculated by the monitoring unit 130 may be output to the pump clock controller 128. The pump clock controller 128 may set a cycle of the clock CLK on the basis of the voltage rising time VR_TIME provided by the monitoring unit 130. Therefore, when the voltage rising time VR_TIME is shorter than the reference time, the pump clock controller 128 may increase the cycle of the clock CLK. Therefore, when the voltage rising time VR_TIME is greater than the reference time, the pump clock controller 128 may decrease the cycle of the clock CLK. The reference time may be a predetermined voltage rising time. The predetermined reference time may be a minimum or maximum voltage rising time to generate an operating voltage. The predetermined reference time may be between the minimum voltage rising time and the maximum voltage rising time for generating the operating voltage.

As set forth above, there may be two methods of changing the cycle of the clock CLK. In other words, the clock cycle setting unit 126 included in the control logic 125 may change the cycle of the clock CLK, or the pump clock controller 128 included in the voltage generator 122 may change the cycle of the clock CLK. Each of the control logic 125 and the monitoring unit 130 may calculate the voltage rising time VR_TIME by storing a time at which the activated voltage generating signal VG_SIG is output or received and a time at which the comparison signal COM_SIG changed to the deactivated state is received.

The clock cycle setting unit 126 may set a cycle of an externally input clock by setting the cycle of the clock CLK. However, the pump clock controller 128 may set the cycle of the externally input clock CLK on the basis of the voltage rising time VR_TIME provided by the monitoring unit 130. In other words, the pump clock controller 128 may change the cycle of the externally input clock CLK and output the pump clock PMP_CLK having the changed cycle.

Therefore, the clock cycle setting unit 126 may change the cycle of the pump clock PMP_CLK by changing the cycle of the clock CLK, whereas the pump clock controller 128 may receive the externally input clock CLK and change the cycle of the pump clock PMP_CLK being output.

When there are a plurality of memory devices, the cycle of the clock CLK may be set according to each memory device. In other words, the cycle of the clock CLK may be determined based on whether the respective memory devices require the same or different operations. When a larger number of operations are required for a memory device, the clock CLK may be set to have a shorter cycle. On the other hand, when a smaller number of operations are required for the memory device, the clock CLK may be set to have a longer cycle.

According to an embodiment, when a plurality of memory devices have the same characteristics, the cycle of the clock CLK may be set according to each memory device. When the characteristics of the memory devices are the same as each other, the respective memory devices may have the same voltage rising time. Therefore, when the plurality of memory devices are set to have the same clock cycle, it may mean that the respective memory devices may have the same voltage rising time. On the other hand, when the plurality of memory devices are set to have different clock cycles, the respective memory devices may have different voltage rising times.

When some of the characteristics of the plurality of memory devices are different from each other, the cycle of the clock CLK may be set according to each memory device. When the characteristics of the memory devices are the same as each other, it may mean that the respective memory devices have the same voltage rising time. Therefore, the clock CLK may be determined to have different cycles to set the plurality of memory devices to have the same voltage rising time. Alternatively, the clocks CLK may be determined to have the same cycle to set the plurality of memory devices to have different voltage rising times.

According to an embodiment, the monitoring unit 130 may output the voltage rising time VR_TIME to the control logic 125. The voltage rising time VR_TIME may refer to the amount of time from a time at which the activated voltage generating signal VG_SIG is received to a time at which the deactivated comparison signal COM_SIG is received. Therefore, the voltage rising time VR_TIME may be determined when the deactivated comparison signal COM_SIG is received.

When the voltage rising time VR_TIME is determined, it may mean that the generation of voltages to be used by the memory device 100 is completed. The operation to be performed by the memory device 100 may be a program operation. As a result, when the voltage rising time VR_TIME is determined, the voltages to be used in the program operation to be performed by the memory device 100 may be generated.

Since the voltage used in the program operation of the memory device 100 is generated, the memory device 100 may perform the program operation. The control logic 125 may output a program command, a program address and program data so that the memory device 100 may perform the program operation. The control logic 125 may output the program command, the program address and the program data when receiving the voltage rising time VR_TIME from the monitoring unit 130. In other words, the program operation may be performed when the control logic 125 receives the voltage rising time VR_TIME.

According to an embodiment, the program operation might not be performed until the voltage rising time VR_TIME is output. In other words, the program operation might not be performed until the voltage for performing the program operation is generated. Therefore, the program operation may be performed after the monitoring unit 130 outputs the voltage rising time VR_TIME.

Figure 7:
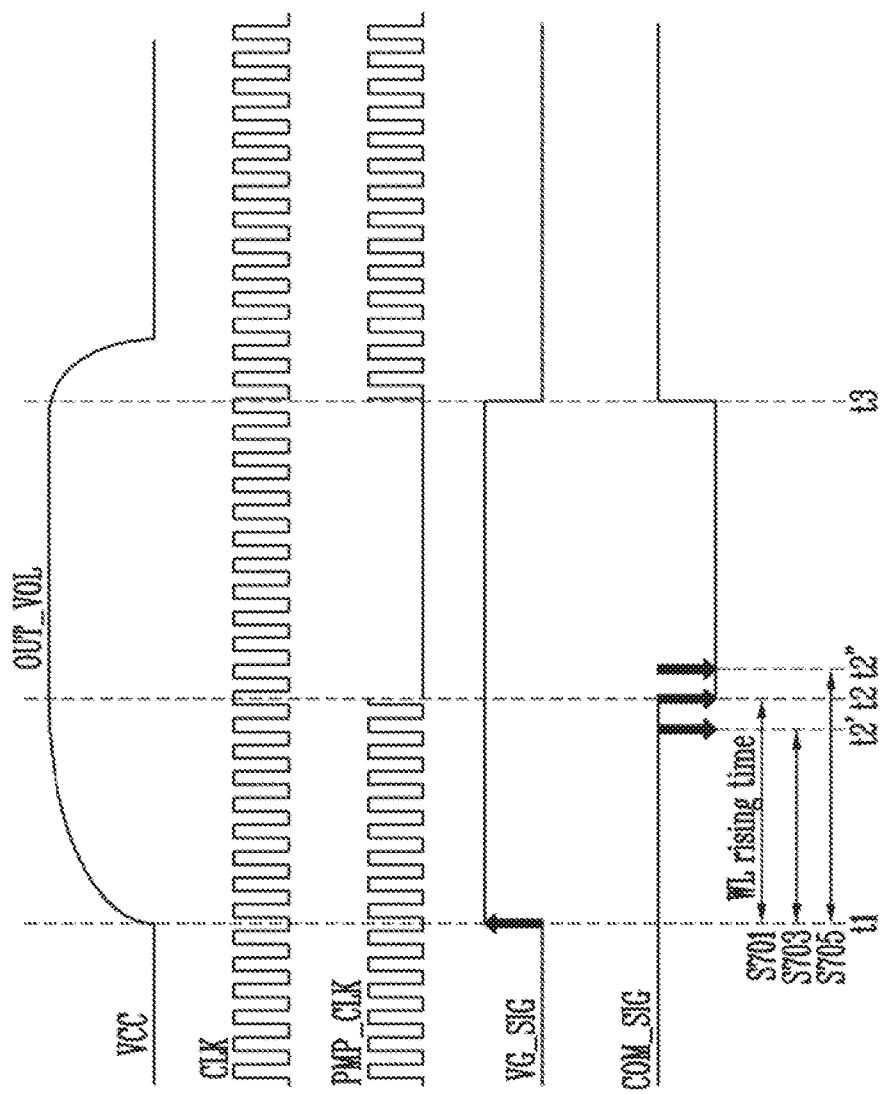
FIG. 7 is a diagram illustrating a method of calculating a voltage rising time.

FIG. 7 is a diagram illustrating a method of calculating a voltage rising time.

Referring to the power supply voltage VCC and the output voltage OUT_VOL of FIG. 7, a change in magnitude of an increased voltage is shown. Referring to FIG. 7, the clock CLK that is input to the pump clock controller 128 from the outside is illustrated. Still referring to FIG. 7, the pump clock PMP_CLK that is output to the pump 127 from the pump 127 is illustrated. Again, referring to FIG. 7, the voltage generating signal VG_SIG that is output from the control logic 125 is illustrated. Referring to FIG. 7, the comparison signal COM_SIG output from the comparator 129 is illustrated. A method of measuring the voltage (WL) rising time VR_TIME is described below with reference to FIG. 7.

The clock CLK input to the pump clock controller 128 from the outside may be continuously input with a high state and a low state alternating with each other. According to an embodiment, based on the clock CLK input to the pump clock controller 128, the pump clock PMP_CLK may be determined.

At a time before t1, since the power supply voltage VCC is less than the output voltage OUT_VOL, the comparison signal COM_SIG in the activated state may be generated and output. The comparison signal COM_SIG in the activated state may be output to the pump clock controller 128 and the control logic 125. Therefore, the pump clock controller 128 may output the clock CLK as the pump clock PMP_CLK.

The pump clock controller 128 may output the pump clock PMP_CLK to the pump 127. However, since the voltage generating signal VG_SIG in the deactivated state is being output to the pump 127, the power supply voltage VCC might not be increased before t1. Therefore, even when the pump clock PMP_CLK is input to the pump 127, the power supply voltage VCC might not be increased.

During a period t1 to t2, the power supply voltage VCC may be increased to reach the output voltage OUT_VOL. The output voltage OUT_VOL may be determined by operations performed on the memory cell array 110. According to an embodiment, when it is necessary to increase the power supply voltage VCC, the control logic 125 may output the voltage generating signal VG_SIG in the activated state (t1). In other words, the control logic 125 may output the voltage generating signal VG_SIG which has changed from the deactivated state to the activated state (t1).

During the period t1 to t2, since the power supply voltage VCC is less than the output voltage OUT_VOL, the comparison signal COM_SIG in the activated state may be generated and output. The comparison signal COM_SIG in the activated state may be output to the pump clock controller 128 and the control logic 125. Therefore, the pump clock controller 128 may output the clock CLK as the pump clock PMP_CLK. Since the pump 127 receives the voltage generating signal VG_SIG having changed to the activated state, the pump 127 may pump the power supply voltage VCC on the basis of the pump clock PMP_CLK.

During a period t2 to t3 when the output voltage OUT_VOL is provided as an operating voltage to the memory cell array 110, the voltage generating signal VG_SIG may be maintained at the activated state. In addition, since the voltage rising from the power supply voltage VCC is the same as the output voltage OUT_VOL, the comparison signal COM_SIG in the deactivated state may be output to the power supply voltage VCC and the control logic 125. Therefore, the pump clock controller 128 may cause the pump clock PMP_CLK to be in a logic low state in response to the comparison signal COM_SIG in the deactivated state. Since the pump clock PMP_CLK is in the logic low state, the output voltage OUT_VOL may be maintained. During the period t2 to t3, when the voltage rising from the power supply voltage VCC is less than the output voltage OUT_VOL, the comparison signal COM_SIG in the activated state may be input to the pump clock controller 128. When the comparison signal COM_SIG in the activated state is input to the pump clock controller 128, the power supply voltage VCC may rise again to reach the output voltage OUT_VOL.

During a period after t3 when the output voltage OUT_VOL is provided as an operating voltage to the memory cell array 110, the voltage generating signal VG_SIG may change from the activated state to the deactivated state. In addition, since the voltage rising from the power supply voltage VCC is less than the output voltage OUT_VOL, the comparison signal COM_SIG in the activated state may be output to the pump clock controller 128 and the control logic 125. Therefore, the pump clock controller 128 may output the clock CLK as the pump clock PMP_CLK. However, since the voltage generating signal VG_SIG in the deactivated state is being output to the pump 127, the power supply voltage VCC might not be increased after t3.

The voltage rising time may be determined by the time between t1 and t2.

For example, since it is necessary to increase the power supply voltage VCC, the control logic 125 may output the voltage generating signal VG_SIG in the activated state. The voltage generating signal VG_SIG in the activated state may be output at the first time (t1). In other words, at the first time (t1), the control logic 125 may output the voltage generating signal VG_SIG which has changed from the deactivated state to the activated state. The first time t1 may be determined as a start point of the voltage rising time.

In addition, the state change time of the comparison signal COM_SIG may be the second time (t2). For example, the voltage rising from the power supply voltage VCC may be the same as the output voltage OUT_VOL, so that the comparison signal COM_SIG in the deactivated state may be output to the control logic 125. The comparison signal COM_SIG in the deactivated state may be changed from the activated state. The state change time of the comparison signal may be determined as an end point (second time) of the voltage rising time. The first time (t1) and the second time (t2) may be stored in the memory device 100. Therefore, the voltage (WL) rising time (i.e., see FIG. 10, S701 to S705) between the first time t1 and the second time t2 may be calculated.

Referring to the down arrows in FIG. 7, various examples of the comparison signal COM_SIG which changes from the activated state to the deactivated state are illustrated. According to an embodiment, a time (t2, t2' or t2") at which the voltage rising from the power supply voltage VCC reaches the output voltage OUT_VOL may be changed by the cycle of the clock CLK.

According to an embodiment, when the clock CLK has a short cycle, the voltage rising from the power supply voltage VCC may quickly reach the output voltage OUT_VOL (t2'). Since the voltage rising from the power supply voltage VCC reaches the output voltage OUT_VOL quickly, the voltage (WL) rising time may be reduced. On the other hand, when the clock CLK has a long cycle, the voltage rising from the power supply voltage VCC may slowly reach the output voltage OUT_VOL (t2"). Since the voltage rising from the power supply voltage VCC reaches the output voltage OUT_VOL slowly, the voltage (WL) rising time may be increased. Therefore, the voltage rising time may be controlled by setting the cycle of the clock CLK.

According to an embodiment, when the voltage rising time is shorter than a reference time t2 (t2'), the clock CLK cycle may be increased so that the WL rising time may be set to the reference time t2. According to an embodiment, when the voltage rising time is longer than the reference time t2 (t2"), the clock CLK cycle may be reduced so that the WL rising time may be set to the reference time t2.

Figure 8:
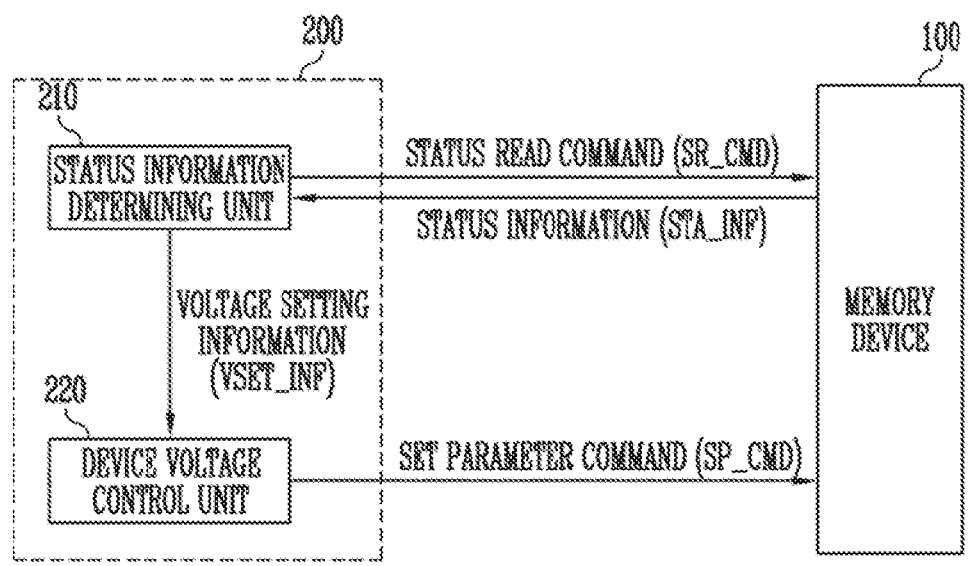
FIG. 8 is a diagram illustrating a method of determining a clock on the basis of a status of a memory device.

FIG. 8 is a diagram illustrating a method of determining the clock CLK on the basis of a status of the memory device 100.

Referring to FIG. 8, the memory controller 200 of FIG. 8 may include the status information determining unit 210 and the device voltage control unit 220.

The status information determining unit 210 may provide the status read command SR_CMD to the memory device 100. The memory device 100 may provide the status information STA_INF in response to the status read command SR_CMD to the status information determining unit 210.

The status information determining unit 210 may provide the status read command SR_CMD to check the status of the memory device 100. The memory device 100 may be in a status where it is necessary to secure power stability, or a status where an operation time is to be reduced. Alternatively, the memory device be in a status where a voltage rising time is long or short. The voltage rising time may refer to a time taken until a voltage necessary for the memory device 100 to operate is generated. The voltage rising time may be longer or shorter than the reference time.

The status information determining unit 210 may receive the status information STA_INF in response to the status read command SR_CMD. The status information determining unit 210 may determine the status of the memory device 100 on the basis of the status information STA_INF. The status information STA_INF may include information about the voltage rising time. The voltage rising time may be received from the memory device 100.

In an embodiment, the status information determining unit 210 may determine the voltage rising time on the basis of the status information STA_INF received from the memory device 100. In other words, the status information STA_INF may include information about the time at which the voltage generating signal VG_SIG is activated and the time at which the comparison signal COM_SIG is deactivated. Therefore, the voltage rising time may be measured by one of the memory device 100 and the memory controller 200.

The status information determining unit 210 may determine whether the voltage rising time VR_TIME is longer or shorter than the reference time after determining the voltage rising time VR_TIME. The reference time may be a predetermined time. The status information determining unit 210 may perform an operation for setting the cycle of the clock CLK according to whether then voltage rising time VR_TIME is longer or shorter than the reference time. In other words, the voltage setting information VSET_INF for setting the cycle of the clock CLK may be generated.

According to an embodiment, when the voltage rising time VR_TIME is shorter than the reference time, the status information determining unit 210 may generate the voltage setting information VSET_INF for increasing the cycle of the clock CLK. On the other hand, when the voltage rising time VR_TIME is longer than the reference time, the status information determining unit 210 may generate the voltage setting information VSET_INF for decreasing the cycle of the clock CLK.

According to an embodiment, when the status information STA_INF received from the memory device 100 includes information about the voltage rising time VR_TIME, the status information determining unit 210 may determine that the increased voltage has reached a target voltage. In other words, when the increased voltage reaches the target voltage, the memory device 100 may output the voltage rising time VR_TIME to the memory controller 200. Therefore, when receiving the status information STA_INF from the memory device 100, the status information determining unit 210 may determine that the increased voltage has reached the target voltage.

For example, the status information STA_INF may include information about time consumed to increase a voltage. The status information determining unit 210 may determine whether the voltage rising time is longer or shorter than the reference time on the basis of the status information STA_INF. The time consumed by the memory device 100 to increase the voltage may be determined on the basis of the status information STA_INF. As a result, the status of the memory device 100 may be checked based on the status information STA_INF.

The memory device 100 may output the status information STA_INF after determining the voltage rising time. According to an embodiment, when the status information STA_INF includes information about the voltage rising time VR_TIME, the status information STA_INF may be output after the voltage rising time VR_TIME is determined. In other words, since the voltage rising time is determined after the power supply voltage VCC reaches an output voltage, the status information STA_INF may be generated when the power supply voltage VCC has reached the output voltage. The memory device 100 may output status information corresponding to the status read command SR_CMD after the voltage rising time VR_TIME is determined.

The status information determining unit 210 may generate and output the voltage setting information VSET_INF on the basis of the status information STA_INF received from the memory device 100. The voltage setting information VSET_INF may include information for setting voltages necessary for the memory device 100. For example, the voltage setting information VSET_INF may include information for changing the cycle of the clock CLK. The cycle of the clock CLK may determine the voltage rising time VR_TIME. The status information determining unit 210 may provide the voltage setting information VSET_INF to the device voltage control unit 220.

According to an embodiment, the memory device 100 may be in a status where power stability needs to be ensured. The power stability may be required when a high power supply is continuously applied to the memory device 100. To ensure the power stability, the cycle of the clock CLK may be set. Therefore, when the status information determining unit 210 receives the status information STA_INF about the status where it is necessary to ensure power stability, the status information determining unit 210 may generate and output the voltage setting information VSET_INF for increasing the cycle of the clock CLK to the device voltage control unit 220.

For example, the status where the power stability is required may refer to a status where it is necessary to control a peak current flowing through the memory device 100. In other words, when the memory device 100 is deteriorated since the peak current is greater than a predetermined value, or when the memory device 100 is in a cold status since the peak current is less than the predetermined value, the memory device 100 may be in a status where it is necessary to control the peak current. Therefore, when the peak current is less than the predetermined value, an operation for increasing the peak current may be performed. On the other hand, when the peak current is greater than the predetermined value, an operation for reducing the peak current may be performed. As a result, when the peak current is lower than the predetermined value, the cycle of the clock CLK may be reduced, and when the peak current is greater than the predetermined value, the cycle of the clock CLK may be increased.

When the memory device 100 is in the status where it is necessary to control the peak current, operations to be performed on the memory device 100 may be scheduled. For example, the operations to be performed on the memory device 100 may be a plurality of operations. The plurality of operations may be controlled for a predetermined time, or may be controlled by the memory controller 200. However, when it is necessary to control the peak current, the plurality of operations may be scheduled. Therefore, when the peak current is less than the predetermined value, the operations to be performed on the memory device 100 may be continuously performed. On the other hand, when the peak current is greater than the predetermined value, the operations to be performed on the memory device 100 may be performed at predetermined intervals. In other words, the operations to be performed on the memory device 100 may be delayed and performed.

According to an embodiment, when there are a plurality of memory devices, the respective memory devices may have different peak currents. Therefore, each of the plurality of memory devices may perform operations to control each of the peak currents. As a result, each of the plurality of memory devices may schedule operations to control each of the peak currents.

According to an embodiment, the voltage rising time of the memory device 100 may be shorter than a reference time. When the voltage rising time of the memory device 100 is shorter than the reference time, an operation for increasing the voltage rising time may be performed. For example, to increase the voltage rising time, the cycle of the clock CLK may be reset. Therefore, the status information determining unit 210 may generate the voltage setting information VSET_INF for increasing the voltage rising time and output the voltage setting information VSET_INF to the device voltage control unit 220.

According to an embodiment, the memory device 100 may be in a status where it is to reduce an operation time. The status where it is to reduce the operation time may refer to a status where an excessive operation time is consumed in the memory device 100. Therefore, when the status information determining unit 210 receives the status information STA_INF about the status where it is to reduce the operation time, the status information determining unit 210 may generate and output the voltage setting information VSET_INF for reducing the cycle of the clock CLK to the device voltage control unit 220.

According to an embodiment, the voltage rising time of the memory device 100 may be longer than the reference time. When the voltage rising time of the memory device 100 is longer than the reference time, an operation for reducing the voltage rising time may be performed. For example, to reduce the voltage rising time, the cycle of the clock CLK may be reset. Therefore, the status information determining unit 210 may generate the voltage setting information VSET_INF for reducing the voltage rising time and output the voltage setting information VSET_INF to the device voltage control unit 220.

The device voltage control unit 220 may receive the voltage setting information VSET_INF from the status information determining unit 210. The voltage setting information VSET_INF may include information for setting the cycle of the clock CLK. The device voltage control unit 220 may provide the set parameter command SP_CMD for generating an operating voltage of the memory device 100 on the basis of the voltage setting information VSET_INF to the memory device 100. For example, the device voltage control unit 220 may provide the set parameter command SP_CMD for setting the cycle of the clock CLK to the provide the memory device 100 on the basis of the voltage setting information VSET_INF received from the status information determining unit 210.

According to an embodiment, when the voltage setting information VSET_INF includes information for reducing the clock CLK cycle, the device voltage control unit 220 may provide the set parameter command SP_CMD to the memory device 100. The memory device 100 may receive the set parameter command SP_CMD and store a parameter corresponding to a value of the reduced clock CLK cycle. Subsequently, the memory device 100 may set the cycle of the clock CLK for generating an operating voltage by using the stored parameter value.

In addition, when the voltage setting information VSET_INF includes information for increasing the clock CLK cycle, the device voltage control unit 220 may provide the set parameter command SP_CMD to the memory device 100. The memory device 100 may receive the set parameter command SP_CMD and store a parameter corresponding to a value of the increased clock CLK cycle. Subsequently, the memory device 100 may set the cycle of the clock CLK for generating an operating voltage by using the stored parameter value.

Figure 9:
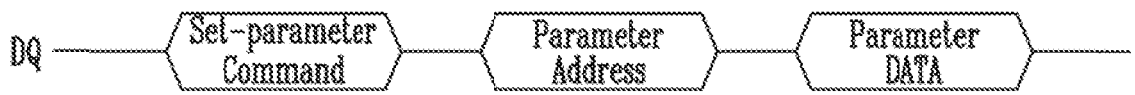
FIG. 9 is a diagram illustrating a method of illustrating a clock cycle by a device voltage control unit.

FIG. 9 is a diagram illustrating a method of illustrating the cycle of the clock CLK by the device voltage control unit 220.

Referring to FIG. 9, the device voltage control unit 220 may change the clock CLK cycle by using a set-parameter command.

The device voltage control unit 220 may sequentially provide the set-parameter command, a parameter address, and parameter data to the memory device 100 through input/output lines DQ.

When it is necessary to change the clock CLK cycle, the device voltage control unit 220 may provide the set-parameter command to the memory device 100. When the set-parameter command is provided to the memory device 100, the memory device 100 may store the parameter data in a register corresponding to the parameter address.

To store a parameter regarding the changed clock CLK cycle, the device voltage control unit 220 may provide the memory device 100 with a parameter address at which the parameter is stored. The memory device 100 may store the parameter data received from the device voltage control unit 220 in the register corresponding to the parameter address.

The device voltage control unit 220 may determine the clock CLK cycle which is increased or decreased on the basis of the voltage setting information VSET_INF received from the status information determining unit 210. The device voltage control unit 220 may provide a value of the determined clock CLK cycle as the parameter data to the memory device 100.

Figure 10:
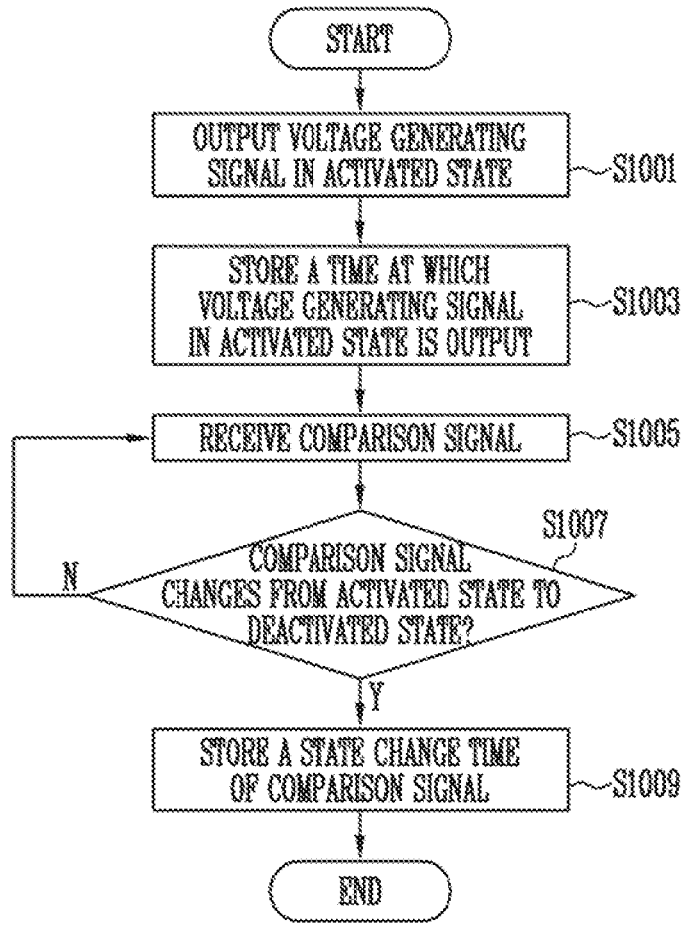
FIG. 10 is a diagram illustrating operations of a memory device according to an embodiment of the present disclosure.

FIG. 10 is a diagram illustrating operations of the memory device 100 according to an embodiment of the present disclosure.

Referring to FIG. 10, at step S1001, the voltage generating signal VG_SIG in an activated state may be output. In other words, to generate voltages necessary for operations to be performed on the memory cell array 110, the voltage generating signal VG_SIG which has changed from a deactivated state to the activated state may be output. For example, the voltage generating signal VG_SIG may be output from the control logic 125. The voltage generating signal VG_SIG may be maintained at the activated state while the output voltage OUT_VOL is provided to the memory cell array 110.

At step S1003, the control logic 125 may store a time at which the control logic 125 outputs the voltage generating signal VG_SIG in the activated state. The time at which the voltage generating signal VG_SIG in the activated state is output may be a first time. The control logic 125 may store information about the first time in the register included in the control logic 125 when the voltage generating signal VG_SIG in the activated state is output. In other words, the memory device 100 may include output time information of the voltage generating signal VG_SIG which has changed from the deactivated state to the activated state. The first time at which the control logic 125 outputs the voltage generating signal VG_SIG which changes from the deactivated state to the activated state may be a starting point of calculating a voltage rising time.

At step S1005, the control logic 125 may receive the comparison signal COM_SIG from the comparator 129. The comparator 129 may generate the comparison signal COM_SIG on the basis of the voltage rising from the power supply voltage VCC. For example, the comparator 129 may compare the voltage rising from the power supply voltage VCC with the output voltage OUT_VOL determined by operations performed by the memory device 100 to generate the comparison signal COM_SIG. The output voltage OUT_VOL may be determined by operations performed on the memory cell array 110. The output voltage OUT_VOL may be previously set and stored in the comparator 129. The output voltage OUT_VOL may be an operating voltage used to perform a predetermined operation on the memory device 100.

The comparator 129 may output the generated comparison signal COM_SIG to the pump clock controller 128. In addition, the comparator 129 may provide the generated comparison signal COM_SIG to the control logic 125 and the monitoring unit 130.

At step S1007, the control logic 125 may check whether the comparison signal COM_SIG received from the comparator 129 has changed from the activated state to the deactivated state. For example, when the voltage rising from the power supply voltage VCC is less than the output voltage OUT_VOL, the comparator 129 may generate the comparison signal COM_SIG in the activated state. When the voltage rising from the power supply voltage VCC is greater than or equal to the output voltage OUT_VOL, the comparator 129 may generate the comparison signal COM_SIG in the deactivated state. Therefore, when the voltage rising from the power supply voltage VCC which is less than the output voltage OUT_VOL becomes equal to the output voltage OUT_VOL, the comparison signal COM_SIG may change from the activated state to the deactivated state.

When the comparison signal COM_SIG changes from the activated state to the deactivated state, the process flow may proceed to step S1009. When the comparison signal COM_SIG does not change from the activated state to the deactivated state, the process flow may proceed to S1005, and the control logic 125 may receive the comparison signal COM_SIG again.

At step S1009, the control logic 125 and/or the monitoring unit 130 may store the state change time of the comparison signal COM_SIG. The state change time of the comparison signal COM_SIG may be a second time. The second time may refer to a time at which the comparison signal COM_SIG which has changed from the activated state to the deactivated state is received. In other words, the memory device 100 may store information about the time at which the state of the comparison signal COM_SIG is changed. The second time may be an end point of calculating the voltage rising time.

According to an embodiment, on the basis of the first time (t1) and the second time (t2) stored in the memory device 100, the voltage (WL) rising time may be calculated. The voltage rising time may be a time between the first time t1 and the second time t2.

Figure 11:
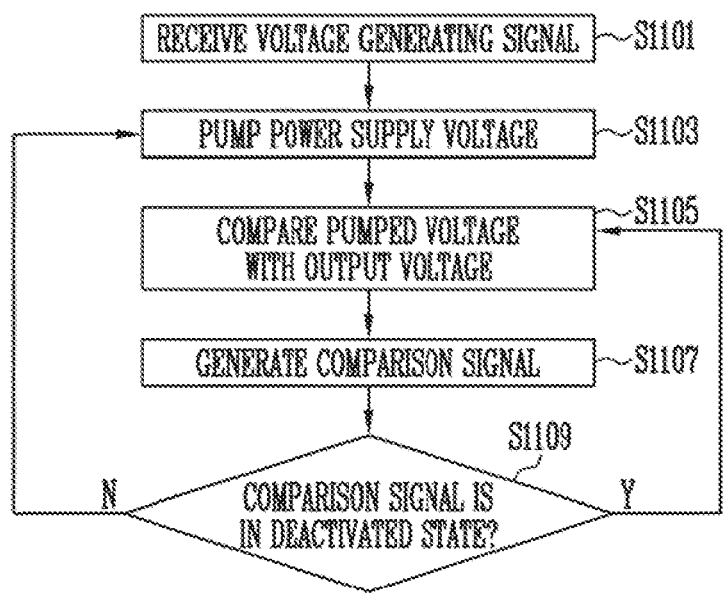
FIG. 11 is a diagram illustrating operations of a memory device according to an embodiment of the present disclosure.

FIG. 11 is a diagram illustrating operations of the memory device 100 according to an embodiment of the present disclosure.

Referring to FIG. 11, at step S1101, the pump 127 may receive the voltage generating signal VG_SIG. The voltage generating signal VG_SIG may be output from the control logic 125. The voltage generating signal VG_SIG may change from the deactivated state to the activated state and be output to generate voltages necessary for operations to be performed. In addition, the voltage generating signal VG_SIG may be maintained at the activated state while the output voltage OUT_VOL is provided to the memory cell array 110. Therefore, the pump 127 may receive the voltage generating signal VG_SIG in the activated or deactivated state from the control logic 125.

At step S1103, the pump 127 may pump the received power supply voltage VCC. The pump 127 may output a voltage obtained by pumping the power supply voltage VCC. The power supply voltage VCC may be externally applied. The pumped voltage may be the output voltage OUT_VOL output from the pump 127.

At step S1105, the comparator 129 may compare the pumped voltage rising from the power supply voltage VCC with the output voltage OUT_VOL. The output voltage OUT_VOL may be determined by operations performed on the memory cell array 110. For example, a voltage level of the output voltage OUT_VOL may be determined by what operations are to be performed on the memory cell array 110. The output voltage OUT_VOL may be previously set and stored in the comparator 129. For example, the level of the output voltage OUT_VOL may be previously set and stored in the comparator 129. The output voltage OUT_VOL may be an operating voltage used to perform a predetermined operation on the memory device 100.

At step S1107, the comparator 129 may generate the comparison signal COM_SIG by comparing the pumped voltage with the output voltage OUT_VOL. The comparator 129 may output the generated comparison signal COM_SIG to the pump clock controller 128 and the control logic 125. In addition, the comparator 129 may output the generated comparison signal COM_SIG to the monitoring unit 130.

At step S1109, it may be checked whether the comparison signal COM_SIG output to the comparator 129 is in a deactivated state or not. For example, when the voltage rising from the power supply voltage VCC is less than the output voltage OUT_VOL, the comparator 129 may generate the comparison signal COM_SIG in the activated state. When the voltage rising from the power supply voltage VCC is greater than or equal to the output voltage OUT_VOL, the comparator 129 may generate the comparison signal COM_SIG in the deactivated state. When the comparison signal COM_SIG is in the deactivated state, the process flow may proceed to step S1105. When the comparison signal COM_SIG is in the activated state, the process flow may proceed to step S1103.

In other words, since it is unnecessary to pump the power supply voltage VCC when the comparison signal COM_SIG is in the deactivated state, the pump clock controller 128 may cause the pump clock PMP_CLK to be in a logic low state. Therefore, until the comparison signal COM_SIG changes from the deactivated state to the activated state, the comparator 129 may compare the voltage rising from the power supply voltage VCC with the output voltage OUT_VOL to generate the comparison signal COM_SIG.

In addition, when the comparison signal COM_SIG is in the activated state, the voltage rising from the power supply voltage VCC may be less than the output voltage OUT_VOL. Thus, it may be necessary to pump the power supply voltage VCC. Accordingly, when the comparison signal COM_SIG is in the activated state, the process flow may proceed to step S1103.

Figure 12:
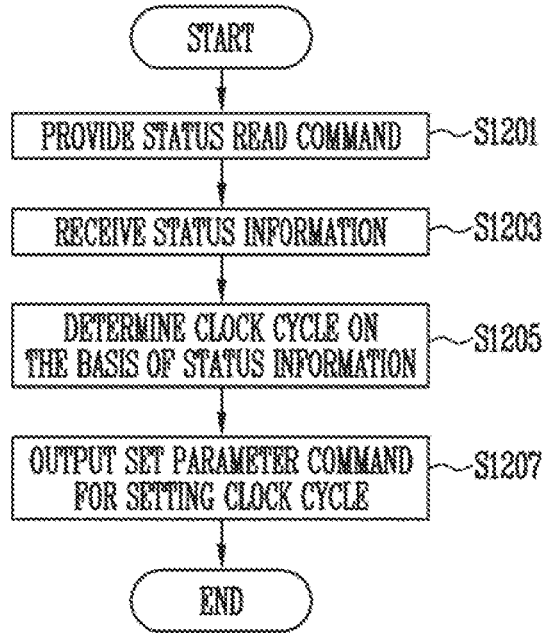
FIG. 12 is a diagram illustrating operations of a memory controller according to an embodiment of the present disclosure.

FIG. 12 is a diagram illustrating operations of the memory controller 200 according to an embodiment of the present disclosure.

Referring to FIG. 12, at step S1201, the status information determining unit 210 may provide the status read command SR_CMD to the memory device 100. The status information determining unit 210 may determine the status of the memory device 100 through the status read command SR_CMD.

At step S1203, the status information determining unit 210 may receive the status information STA_INF in response to the status read command SR_CMD from the memory device 100. The status information STA_INF may include information about a status in which it is necessary to ensure the stability of the memory device 100, or a status in which it is to reduce an operation time of the memory device 100. The status information determining unit 210 may output the voltage setting information VSET_INF for generating an operating voltage of the memory device 100 on the basis of the status of the memory device 100. The device voltage may include an operating voltage for performing a predetermined operation.

At step S1205, the status information determining unit 210 may determine the clock CLK cycle on the basis of the status information STA_INF. The cycle of the clock CLK may determine a voltage rising time. The voltage rising time may refer to a time taken for the operating voltage to reach a target reference voltage.

According to an embodiment, when the status of the memory device 100 which is stored in the status information STA_INF corresponds to a status where it is necessary to ensure power stability, the status information determining unit 210 may generate the voltage setting information VSET_INF for increasing the cycle of the clock CLK and output the voltage setting information VSET_INF to the device voltage control unit 220. According to an embodiment, when the status of the memory device 100 which is stored in the status information STA_INF corresponds to a status where it is to reduce an operation time, the status information determining unit 210 may generate the voltage setting information VSET_INF for reducing the cycle of the clock CLK and may output the voltage setting information VSET_INF to the device voltage control unit 220.

At step S1207, the device voltage control unit 220 may provide the set parameter command SP_CMD for setting the cycle of the clock CLK to the provide the memory device 100 on the basis of the voltage setting information VSET_INF received from the status information determining unit 210. The memory device 100 may store a parameter value of the determined clock CLK cycle in the register in response to the set parameter command SP_CMD. Subsequently, an operating voltage may be generated according to the clock CLK cycle stored in the register.

Figure 13:
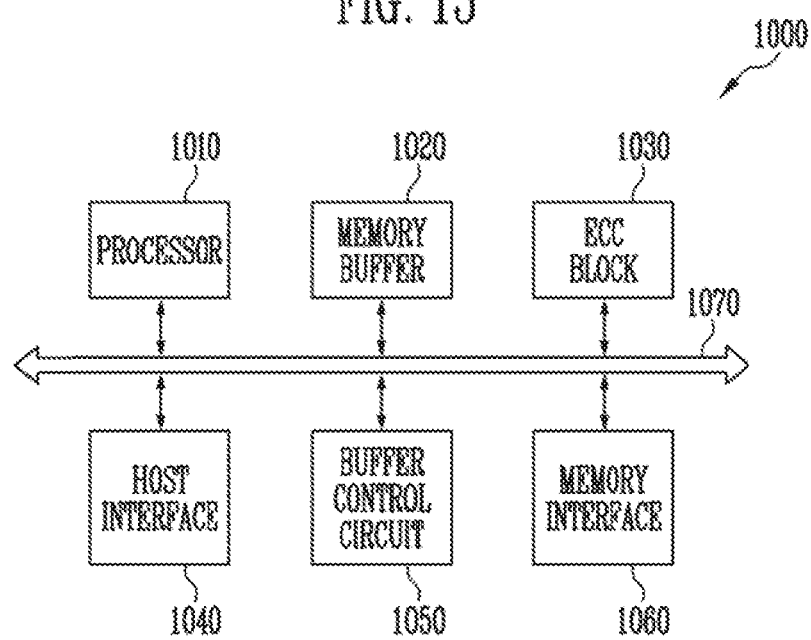
FIG. 13 is a diagram illustrating an embodiment of a memory controller of FIG. 1.

FIG. 13 is a diagram illustrating an embodiment of the memory controller 200 of FIG. 1.

A memory controller 1000 may be coupled to a host and a memory device. In response to a request from the host, the memory controller 1000 may access the memory device. For example, the memory controller 1000 may control write, read, erase, and background operations of the memory device. The memory controller 1000 may provide an interface between the memory device and the host. The memory controller 1000 may drive firmware for controlling the memory device.

Referring to FIG. 13, the memory controller 1000 may include a processor 1010, a memory buffer 1020, an error correction code (ECC) block 1030, a host interface 1040, a buffer control circuit 1050, a memory interface 1060, and a bus 1070.

The bus 1070 may provide a channel between components of the memory controller 1000.

The processor 1010 may control the overall operation of the memory controller 1000 and may perform a logical operation. The processor 1010 may communicate with an external host through the host interface 1040 and communicate with the memory device through the memory interface 1060. Further, the processor 1010 may communicate with the memory buffer 1020 through the buffer control circuit 1050. The processor 1010 may control operations of the storage device by using the memory buffer 1020 as a working memory, a cache memory or a buffer memory.

The processor 1010 may perform the function of a flash translation layer (FTL). The processor 1010 may translate a logical block address (LBA), provided by the host, into a physical block address (PBA) through the flash translation layer FTL. The flash translation layer FTL may receive the logical block address LBA and translate the logical block address LBA into the physical block address PBA by using a mapping table. There may be various address mapping methods for the flash translation layer FTL, depending on a mapping unit. Typical address mapping methods may include a page mapping method, a block mapping method and a hybrid mapping method.

The processor 1010 may randomize data received from the host. For example, the processor 1010 may use a randomizing seed to randomize data received from the host. The randomized data may be provided, as data to be stored, to the memory device and may be programmed in the memory cell array.

The processor 1010 may derandomize data received from the memory device during a read operation. For example, the processor 1010 may derandomize the data received from the memory device using a derandomizing seed. The derandomized data may be output to the host.

According to an embodiment, the processor 1010 may run software or firmware to perform randomizing and derandomizing operations.

The memory buffer 1020 may serve as an operation memory, a cache memory, or a buffer memory of the processor 1010. The memory buffer 1020 may store codes and commands executed by the processor 1010. The memory buffer 1020 may store data that is processed by the processor 1010. The memory buffer 1020 may include a static RAM (SRAM) or a dynamic RAM (DRAM).

The ECC block 1030 may perform error correction. The ECC block 1030 may perform ECC encoding based on data to be written to the memory device through the memory interface 1060. The ECC-encoded data may be transferred to the memory device through the memory interface 1060. The ECC block 1030 may perform ECC decoding based on data received from the memory device through the memory interface 1060. For example, the ECC block 1030 may be included as the component of the memory interface 1060 in the memory interface 1060.

The host interface 1040 may communicate with the external host under the control of the processor 1010. The host interface 1040 may perform communication using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The buffer control circuit 1050 may control the memory buffer 1020 under the control of the processor 1010.

The memory interface 1060 may communicate with the memory device under the control of the processor 1010. The memory interface 1060 may transmit/receive commands, addresses, and data to/from the memory device through channels.

For example, the memory controller 1000 might not include the memory buffer 1020 and the buffer control circuit 1050.

For example, the processor 1010 may control the operations of the memory controller 1000 using codes. The processor 1010 may load codes from a nonvolatile memory device (e.g., ROM) provided in the memory controller 1000. In another example, the processor 1010 may load codes from the memory device through the memory interface 1060.

For example, the bus 1070 of the memory controller 1000 may be divided into a control bus and a data bus. The data bus may be configured to transmit data in the memory controller 1000, and the control bus may be configured to transmit control information such as commands or addresses in the memory controller 1000. The data bus and the control bus may be isolated from each other and may neither interfere with nor influence each other. The data bus may be coupled to the host interface 1040, the buffer control circuit 1050, the ECC block 1030, and the memory interface 1060. The control bus may be coupled to the host interface 1040, the processor 1010, the buffer control circuit 1050, the memory buffer 1020, and the memory interface 1060.

Figure 14:
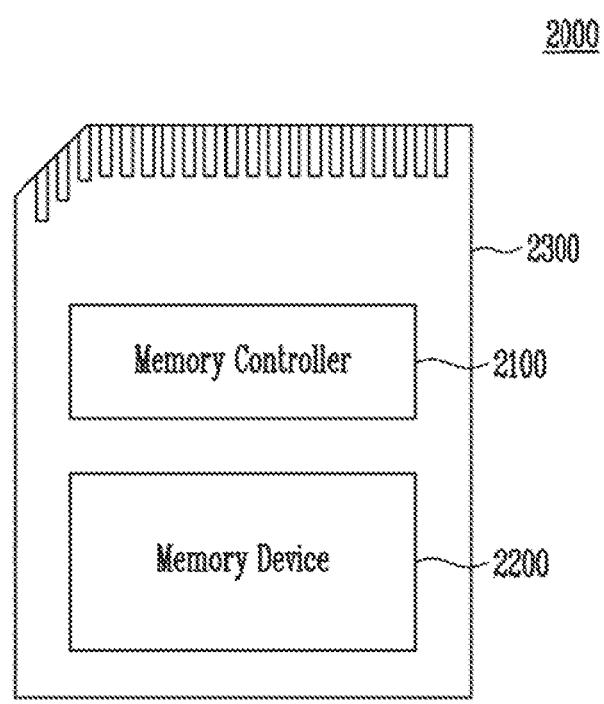
FIG. 14 is a block diagram illustrating a memory card system to which a storage device according to an embodiment of the present disclosure is applied.

FIG. 14 is a block diagram illustrating a memory card system 2000 to which the storage devices 50 according to an embodiment is applied.

Referring to FIG. 14, the memory card system 2000 may include a memory controller 2100, a memory device 2200, and a connector 2300.

The memory controller 2100 may be coupled to the memory device 2200. The memory controller 2100 may access the memory device 2200. For example, the memory controller 2100 may control read, write, erase, and background operations of the memory device 2200. The memory controller 2100 may be configured to provide an interface between the memory device 2200 and the host. The memory controller 2100 may be configured to drive firmware for controlling the memory device 2200. The memory device 2200 may be configured in the same manner as the memory devices 100, described above with reference to FIG. 2.

In an embodiment, the memory controller 2100 may include components, such as a Random Access Memory (RAM), a processing unit, a host interface, a memory interface, and an ECC block.

The memory controller 2100 may communicate with an external device through the connector 2300. The memory controller 2100 may communicate with an external device (e.g., host) based on a specific communication protocol. For example, the memory controller 2100 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), WiFi, Bluetooth, and nonvolatile memory express (NVMe) protocols. For example, the connector 2300 may be defined by at least one of the above-described various communication protocols.

In an embodiment, the memory device 2200 may be embodied as any of various nonvolatile memory devices, such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin-Torque Magnetic RAM (STT-MRAM), etc.

The memory controller 2100 and the memory device 2200 may be integrated into a single semiconductor device to form a memory card. For example, the memory controller 2100 and the memory device 2200 may be integrated into a single semiconductor device and form a memory card, such as a personal computer memory card international association (PCMCIA), a compact flash card (CF), a smart media card (SM or SMC), a memory stick multimedia card (MMC, RS-MMC, or MMCmicro), an SD card (SD, miniSD, microSD, or SDHC), a universal flash storage (UFS), and the like.

Figure 15:
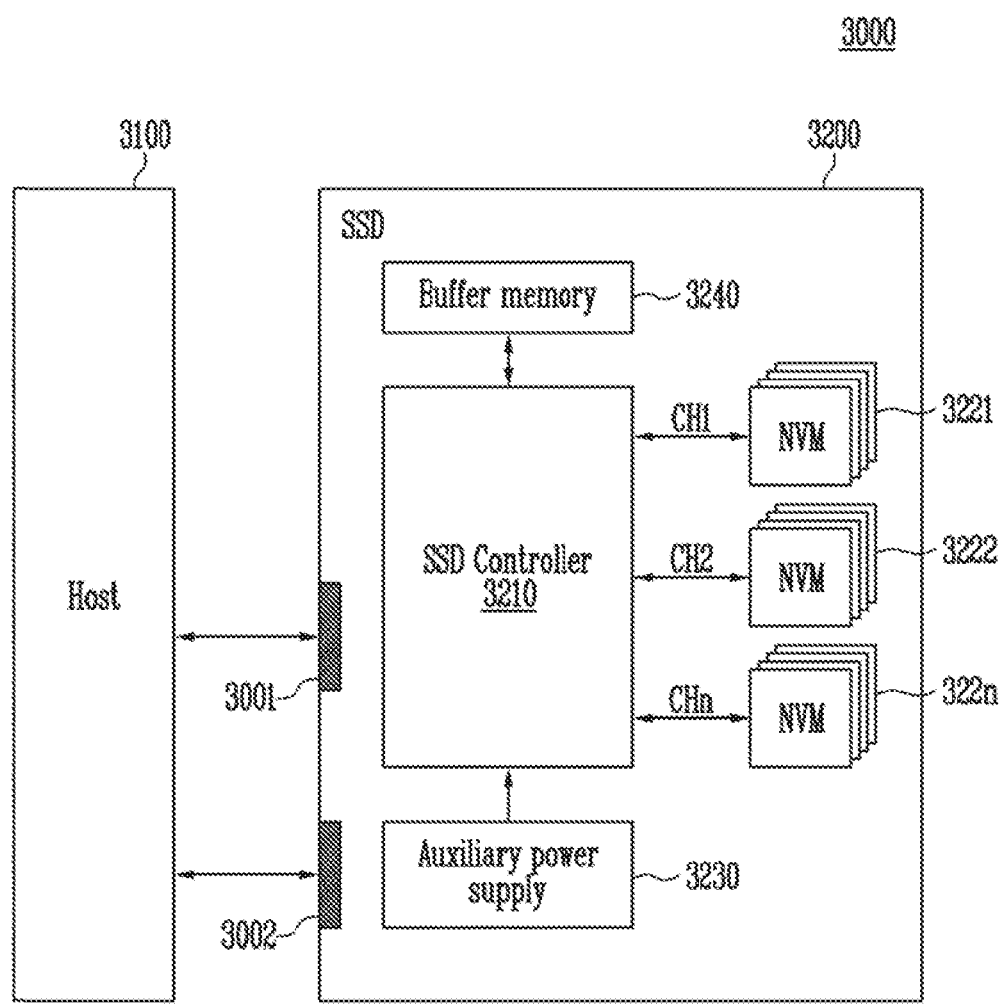
FIG. 15 is a block diagram illustrating an example of a solid state drive (SSD) system to which a storage device according to an embodiment of the present disclosure is applied.

FIG. 15 is a block diagram illustrating an example of a solid state drive (SSD) system 3000 to which the storage devices 50 according to an embodiment is applied.

Referring FIG. 15, the SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controllers 200, described above with reference to FIG. 1.

The SSD controller 3210 may control the plurality of flash memories 3221 to 322n in response to the signals SIG received from the host 3100. According to an embodiment, the signals SIG may be signals based on the interfaces of the host 3100 and the SSD 3200. For example, the signals SIG may be defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), WiFi, Bluetooth, and nonvolatile memory express (NVMe) interfaces, etc.

The auxiliary power supply 3230 may be coupled to the host 3100 through the power connector 3002. The auxiliary power supply 3230 may be supplied and charged with power PWR from the host 3100. The auxiliary power supply 3230 may supply the power of the SSD 3200 when power is not smoothly supplied from the host 3100. For example, the auxiliary power supply 3230 may be positioned inside or outside the SSD 3200. For example, the auxiliary power supply 3230 may be disposed in a main board and may supply auxiliary power to the SSD 3200.

The buffer memory 3240 may function as a buffer memory of the SSD 3200. For example, the buffer memory 3240 may temporarily store data received from the host 3100 or data received from the plurality of flash memories 3221 to 322n, or may temporarily store metadata (e.g., mapping tables) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM, etc.

Figure 16:
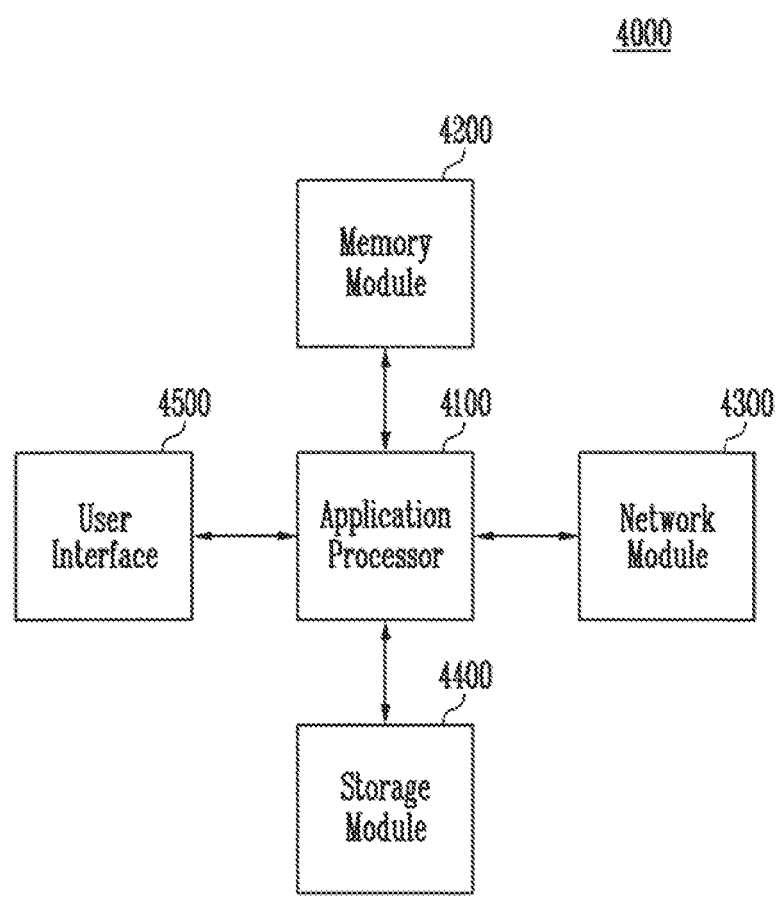
FIG. 16 is a block diagram illustrating a user system to which the storage device 50 according to an embodiment is applied.

FIG. 16 is a block diagram illustrating a user system 4000 to which the storage devices 50 according to an embodiment is applied.

Referring to FIG. 16, the user system 4000 may include an application processor 4100, a memory module 4200, a network module 4300, a storage module 4400, and a user interface 4500.

The application processor 4100 may run components included in the user system 4000, an Operating System (OS), or a user program. For example, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDARM, LPDDR3 SDRAM, and LPDDR3 SDRAM or nonvolatile RAMs such as PRAM, ReRAM, MRAM, and FRAM, etc. For example, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), Wimax, WLAN, UWB, Bluetooth, or WiFi communication, etc. For example, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. For example, the storage module 4400 may be embodied as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. For example, the storage module 4400 may be provided as a removable storage medium (i.e., removable drive), such as a memory card or an external drive of the user system 4000.

For example, the storage module 4400 may include a plurality of nonvolatile memory devices, and the plurality of nonvolatile memory devices may be operated in the same manner as the memory devices described above with reference to FIGS. 2 to 5. The storage module 4400 may operate in the same manner as the storage devices 50 described above with reference to FIG. 1.

The user interface 4500 may include interfaces which input data or instructions to the application processor 4100 or output data to an external device. According to an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device, etc. The user interface 4500 may further include user output interfaces such as a Liquid Crystal Display (LCD), an Organic Light Emitting Diode (OLED) display device, an Active Matrix OLED (AMOLED) display device, an LED, a speaker, and a motor, etc.

According to embodiments of the present disclosure, a storage device capable of calculating a voltage rising time and an operating method thereof may be provided.

It will be apparent to those skilled in the art that various modifications can be made to the above-described embodiments without departing from the spirit or scope of the disclosure. Thus, it is intended that the description cover all such modifications provided they come within the scope of the appended claims and their equivalents.

It should be understood that many variations and modifications of the concepts described herein will still fall within the spirit and scope of the present disclosure as defined in the accompanying claims and equivalents thereof.

Thus, it is intended that the present description cover all such modifications provided they come within the scope of the appended claims and their equivalents.

In the above-discussed embodiments, all steps may be selectively performed or skipped. In addition, the steps in each embodiment might not always be performed in regular order. Furthermore, the embodiments disclosed in the present specification and the drawings aims to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the concepts described herein will still fall within the spirit and scope of the present disclosure as defined in the accompanying claims and equivalents thereof.

What is claimed is:

1. A memory device, comprising:
   a memory cell array comprising at least one memory block;
   a voltage generator configured to receive a power supply voltage and increase the power supply voltage until the increased power supply voltage is equal to or greater than a reference voltage; and
   a control logic configured to initiate, at a first time, when the voltage generator begins increasing the power supply voltage and store a second time corresponding to when the increased power supply voltage is equal to or greater than the reference voltage,
   wherein the reference voltage is a voltage level used to perform an operation on the memory cell array, and
   wherein the voltage generator controls a time consumed to reach the reference voltage from the power supply voltage based on a duration of time that elapses from the first time to the second time.

2. The memory device of claim 1, wherein the voltage generator generates a comparison signal and changes a state of the comparison signal at the second time when the increased power supply voltage is equal to or greater than the reference voltage.

3. The memory device of claim 2, wherein the comparison signal is in an activated state when the increased voltage is less than the reference voltage and in a deactivated state when the increased voltage is greater than or equal to the reference voltage.

4. The memory device of claim 2, wherein the state of the comparison signal changes from an activated state to a deactivated state at the second time.

5. The memory device of claim 1, wherein the control logic activates a voltage generating signal at the first time to initiate the voltage generator to begin increasing the power supply voltage.

6. The memory device of claim 1, wherein the control logic calculates a voltage rising time corresponding to the duration of time that elapses from the first time to the second time.

7. The memory device of claim 1,
   wherein the voltage generator is configured to begin increasing the power supply voltage based on a voltage generating signal received from the control logic, and
   wherein the voltage generator further comprises:
   a pump configured to increase the power supply voltage based on a pump clock and the voltage generating signal;
   a comparator configured to generate and output a comparison signal by determining whether the increased power supply voltage is equal to or greater than the reference voltage; and
   a pump clock controller configured to generate the pump clock based on the comparison signal and an externally input clock.

8. The memory device of claim 7, wherein when the increased power supply voltage is greater than or equal to the reference voltage, the control logic outputs the voltage generating signal in an activated state while the increased voltage is provided to the memory cell array.

9. The memory device of claim 7, wherein the pump clock controller outputs the externally input clock as the pump clock in response to the comparison signal in an activated state and causes the pump clock to be in a logic low state in response to the comparison signal in a deactivated state.

10. The memory device of claim 7, further comprising a monitoring unit configured to receive the voltage generating signal and the comparison signal,
wherein the monitoring unit is configured to store a time at which the voltage generating signal is received by the control logic in an activated state, and calculate a voltage rising time corresponding to a duration of time that elapses from the time at which the activated voltage generating signal is received to a time when the comparison signal received by the comparator is in a deactivated state,
wherein the comparison signal is in the deactivated state when the power supply voltage is equal to or greater than the reference voltage, and
wherein the voltage generator begins increasing the power supply voltage when the voltage generating signal received from the control logic is in the activated state.

11. The memory device of claim 10, wherein the monitoring unit outputs the voltage rising time to the pump clock controller.

12. The memory device of claim 11, wherein the pump clock controller increases a cycle of the pump clock when the voltage rising time is less than a reference time.

13. The memory device of claim 11, wherein the pump clock controller decreases a cycle of the pump clock when the voltage rising time is greater than a reference time.

14. A method of operating a memory device including a memory cell array, the method comprising:
increasing a power supply voltage on the basis of a voltage generating signal;
generating a comparison signal by comparing an increased voltage with a reference voltage when the power supply voltage is increased; and
storing a state change time of the comparison signal,
wherein the reference voltage is a voltage level used in performing an operation on the memory cell array, and
wherein a time consumed to reach the reference voltage from the power supply voltage is controlled based on a duration of time that elapses from the first time to the second time.

15. The method of claim 14, wherein the generating of the comparison signal comprises:
generating the comparison signal in an activated state when the increased voltage is less than the reference voltage; and
generating the comparison signal in a deactivated state when the increased voltage is greater than or equal to the reference voltage.

16. The method of claim 15, wherein the storing of the state change time of the comparison signal comprises storing a time at which the comparison signal changes from the activated state to the deactivated state.

17. The method of claim 15, wherein the increasing of the power supply voltage comprises:
generating a pump clock on the basis of the comparison signal and an externally input clock; and
increasing the power supply voltage on the basis of the pump clock and the voltage generating signal.

18. The method of claim 17, wherein the generating of the pump clock comprises outputting the externally input clock as the pump clock in response to the comparison signal in the activated state, and causing the pump clock to be in a logic low state in response to the comparison signal in the deactivated state.

19. The method of claim 17, further comprising:
storing a first time at which the voltage generating signal in an activated state is generated; and
calculating a voltage rising time from the first time to a second time corresponding to a state change time of the comparison signal.

20. The method of claim 19, further comprising setting a cycle of the pump clock based on the voltage rising time.

* * * * *